(12) United States Patent
Cai et al.

(10) Patent No.: US 12,394,555 B2
(45) Date of Patent: Aug. 19, 2025

(54) TRANSFORMER MODULE AND POWER MODULE

(71) Applicant: Delta Electronics (Shanghai) Co., Ltd., Shanghai (CN)

(72) Inventors: Chaofeng Cai, Shanghai (CN); Jianhong Zeng, Shanghai (CN); Shouyu Hong, Shanghai (CN); Rui Wu, Shanghai (CN); Haoyi Ye, Shanghai (CN); Yiqing Ye, Shanghai (CN); Xiaoni Xin, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/762,688

(22) Filed: Jul. 3, 2024

(65) Prior Publication Data

US 2024/0363282 A1    Oct. 31, 2024

Related U.S. Application Data

(62) Division of application No. 16/671,153, filed on Oct. 31, 2019, now Pat. No. 12,080,465.

(30) Foreign Application Priority Data

Nov. 2, 2018    (CN) .......................... 201811301239.7
Oct. 30, 2019    (CN) .......................... 201911042722.2

(51) Int. Cl.
*H01F 5/00* (2006.01)
*H01F 27/02* (2006.01)
(Continued)

(52) U.S. Cl.
CPC ....... *H01F 27/2847* (2013.01); *H01F 27/027* (2013.01); *H01F 27/292* (2013.01); *H01F 27/32* (2013.01); *H01F 41/0233* (2013.01)

(58) Field of Classification Search
USPC .................................................. 336/200, 221
See application file for complete search history.

(56) References Cited

U.S. PATENT DOCUMENTS 3,826,967 A    7/1974    Wilkinson et al.
4,253,231 A    3/1981    Nouet
(Continued)

FOREIGN PATENT DOCUMENTS

CN    1202265 A    12/1998
CN    1372278 A    10/2002
(Continued)

OTHER PUBLICATIONS

Corresponding extended European Search Report, Jun. 24, 2020, the date of completion of the search.

(Continued)

*Primary Examiner* — Ronald Hinson
(74) *Attorney, Agent, or Firm* — CKC & Partners Co., LLC

(57) ABSTRACT

A transformer module and a power module are provided. The transformer module includes: a magnetic core, a first winding and a second winding. The magnetic core includes at least one magnetic column at least partially covered by a multi-layer carrier including a plurality of horizontal copper foils and connecting copper foils. Horizontal copper foils are located on horizontal wiring layers, and connecting copper foils are disposed to connect horizontal copper foils. First and second windings surround the magnetic column, and the second winding is located outside the first winding. Both the first and second windings are formed by a horizontal copper foil and a connecting copper foil; two ends of the first winding are electrically connected to first and second surface-mounted pins; two ends of the second winding are electrically connected to third and fourth surface-mounted (Continued)

pins; these pins are disposed on at least one surface of the transformer module.

20 Claims, 20 Drawing Sheets

(51) Int. Cl.
*H01F 27/28* (2006.01)
*H01F 27/29* (2006.01)
*H01F 27/32* (2006.01)
*H01F 41/02* (2006.01)

(56) References Cited

U.S. PATENT DOCUMENTS

| | | | |
|---|---|---|---|
| 4,777,465 | A | 10/1988 | Meinel |
| 5,631,822 | A | 5/1997 | Silberkleit et al. |
| 5,877,666 | A | 3/1999 | Johnson, Jr. et al. |
| 6,040,753 | A | 3/2000 | Ramakrishnan et al. |
| 6,188,305 | B1 | 2/2001 | Chang et al. |
| 7,468,649 | B2 | 12/2008 | Chandrasekaran |
| 8,295,066 | B2 | 10/2012 | Lin |
| 9,001,524 | B1 | 4/2015 | Akre |
| 9,425,761 | B2 * | 8/2016 | Zuo ............... H03H 7/0138 |
| 9,472,334 | B2 | 10/2016 | Syvaranta et al. |
| 10,297,379 | B2 | 5/2019 | Gold et al. |
| 10,748,697 | B2 * | 8/2020 | Madsen ............. H01F 19/00 |
| 11,664,157 | B2 | 5/2023 | Hong et al. |
| 2002/0088269 | A1 | 7/2002 | Cavallaro et al. |
| 2002/0105406 | A1 * | 8/2002 | Liu ................. H01F 27/2804 |
| | | | 336/200 |
| 2006/0176135 | A1 * | 8/2006 | Winter ................ H05K 1/165 |
| | | | 336/200 |
| 2007/0020969 | A1 * | 1/2007 | Yungers ............ G06K 7/10316 |
| | | | 439/77 |
| 2007/0139976 | A1 | 6/2007 | deRochemont |
| 2008/0239759 | A1 | 10/2008 | Nakahori |
| 2010/0164670 | A1 | 7/2010 | Nakahori et al. |
| 2010/0188183 | A1 | 7/2010 | Shpiro |
| 2010/0232181 | A1 | 9/2010 | Nakahori et al. |
| 2012/0056297 | A1 | 3/2012 | Akhtar et al. |
| 2012/0146757 | A1 * | 6/2012 | Tsai ................. H01F 17/0013 |
| | | | 336/200 |
| 2013/0187743 | A1 * | 7/2013 | Chang ............... H01F 17/0013 |
| | | | 336/200 |
| 2013/0328165 | A1 | 12/2013 | Harburg et al. |
| 2014/0062646 | A1 | 3/2014 | Morrissey et al. |
| 2014/0266546 | A1 | 9/2014 | Mao |
| 2015/0200049 | A1 * | 7/2015 | Kim ................. H01F 27/2804 |
| | | | 336/200 |
| 2015/0235753 | A1 * | 8/2015 | Chatani ............. H01F 27/2804 |
| | | | 336/200 |
| 2016/0086709 | A1 | 3/2016 | Quilici |
| 2016/0261179 | A1 | 9/2016 | Blanchard et al. |
| 2016/0307686 | A1 | 10/2016 | Moon et al. |
| 2017/0004915 | A1 | 1/2017 | Park et al. |
| 2017/0032883 | A1 | 2/2017 | Hong et al. |
| 2017/0117090 | A1 | 4/2017 | Liu et al. |
| 2017/0222562 | A1 | 8/2017 | Nakahori |
| 2017/0345756 | A1 | 11/2017 | Yin et al. |
| 2018/0096780 | A1 * | 4/2018 | Sekiguchi ........... H01F 27/2804 |
| 2018/0175736 | A1 | 6/2018 | Ishigaki |
| 2018/0211761 | A1 | 7/2018 | Zhang et al. |
| 2019/0272936 | A1 * | 9/2019 | Zhang ................ H01F 27/24 |
| 2019/0341182 | A1 * | 11/2019 | Guo .................. H01F 17/04 |
| 2022/0084733 | A1 * | 3/2022 | Iida ................. H01F 17/0033 |

FOREIGN PATENT DOCUMENTS

| | | |
|---|---|---|
| CN | 101051549 A | 10/2007 |
| CN | 101322201 A | 12/2008 |
| CN | 201348924 Y | 11/2009 |
| CN | 201478093 U | 5/2010 |
| CN | 102360852 A | 2/2012 |
| CN | 202839237 U | 3/2013 |
| CN | 103269149 A | 8/2013 |
| CN | 103943306 A | 7/2014 |
| CN | 104376955 A | 2/2015 |
| CN | 105321677 A | 2/2016 |
| CN | 105590734 A | 5/2016 |
| CN | 105789031 A | 7/2016 |
| CN | 106030733 A | 10/2016 |
| CN | 107171532 A | 9/2017 |
| CN | 107294390 A | 10/2017 |
| CN | 109003779 A | 12/2018 |
| DE | 3732249 A1 | 4/1989 |
| DE | 19725865 A1 | 1/1998 |
| DE | 19954682 C1 | 8/2001 |
| EP | 3648128 A2 | 5/2020 |
| EP | 4170689 A1 | 4/2023 |
| JP | S59186313 A | 10/1984 |
| JP | H05315520 A | 11/1993 |
| JP | 2008305620 A | 12/2008 |
| JP | 2015228436 A | 12/2015 |
| TW | 201023216 A | 6/2010 |
| WO | 2020033325 A1 | 2/2020 |
| WO | 2022006691 A1 | 1/2022 |

OTHER PUBLICATIONS

Corresponding China Office Action mailed on Nov. 4, 2020.
Corresponding extended European search report mailed on Apr. 24, 2020.
Khan Afia et al., "Design and Comparative Analysis of Litz and Copper Foil Transformers for High Frequency Applications," 2018 20th European Conference on Power Electronics and Applications (EPE'18 ECCE Europe), Sep. 17, 2018, 10 pages.
Corresponding European search report issued on Feb. 13, 2020.
Corresponding European office action issued on Mar. 19, 2021.
Corresponding China office action issued on Apr. 6, 2021.
Corresponding Notice of Allowance of US application issued on May 5, 2021.
Corresponding China office action issued on Jul. 26, 2021.
Corresponding China Office Action issued on Apr. 19, 2022 with its English translation.
Corresponding China Notice of Allowance issued on Oct. 19, 2022.
Corresponding US office action issued on Dec. 8, 2022.
Corresponding Notice of Allowance of US application issued on Mar. 20, 2023.
Corresponding extended European search report issued on Jun. 19, 2023.
Corresponding US office action issued on Aug. 11, 2023.
Related NOA of U.S. Appl. No. 17/024,720 issued on Jan. 24, 2024.
The Extended European Search Report of application No. 24163741.2 mailed on Jun. 28, 2024.
Related NOA of U.S. Appl. No. 18/642,793 issued on Dec. 18, 2024.

* cited by examiner

TRANSFORMER MODULE AND POWER MODULE

CROSS REFERENCE TO RELEVANT APPLICATIONS

The present application is a divisional application of U.S. patent application No. U.S. Ser. No. 16/671,153, filed on Oct. 31, 2019, which claims the priority of the Chinese patent application No. 201811301239.7, entitled "TRANSFORMER MODULE AND POWER MODULE", filed on Nov. 2, 2018, and the priority of the Chinese patent application No. 201911042722.2, entitled "TRANSFORMER MODULE AND POWER MODULE", filed on Oct. 30, 2019. The afore-mentioned patent applications are hereby incorporated by reference in their entireties.

TECHNICAL FIELD

The present disclosure relates to the field of transformer technologies and, in particular, to a transformer module and a power module.

BACKGROUND

As people's demands for smart living are getting higher, the demand for data processing in society is growing. The global energy consumption in data processing reaches an average of hundreds of billions or even trillions of degrees per year; and a large data center may cover tens of thousands of square meters. Therefore, high efficiency and high power density are key indicators for the healthy development of this industry.

The key unit of a data center is a server. A mainboard of the server is usually composed of data processing chips including a central processing unit (CPU), chipsets, a memory and the like, as well as their power supply and necessary peripheral components. With the processing capacity of the server per unit volume being increasing, it means that the number and integration of these processing chips are also increasing, resulting in an increase in space occupation and power consumption. The power supply which supplies power for these chip is also referred to as a mainboard power supply because the power supply and the data processing chip are on the same mainboard. As a result, the mainboard power supply is expected to have higher efficiency, higher power density and smaller size to support energy savings and footprint reduction for the entire server and even the entire data center. In order to meet the demand of high power density, the switching frequency of the power supply is also getting higher and higher, and the switching frequency of a low-voltage and high-current power supply in the industry is basically 1 megahertz (MHz).

Most transformers for the low-voltage and high-current application are implemented by means of a multi-layer printed circuit board (PCB). FIG. 1 is a side view of a transformer using a multi-layer PCB provided by the prior art.

As shown in FIG. 1, PCB wiring layer metal winding is implemented by a horizontal winding process, and the winding is spirally formed on a plane or winding layer of the PCB. And the PCB is usually disposed sleeving a magnetic column such that the magnetic column is perpendicular or nearly perpendicular to the PCB, thereby, the magnetic column is perpendicular or nearly perpendicular to each of winding wiring layers formed on the PCB. The metal winding formed on the wiring layer substantially has two directions, the first direction is parallel to the length direction of the magnetic column and the second direction is perpendicular to the length direction of the magnetic column. Further, the size of the metal winding in the first direction is substantially the wiring thickness, which is W; and the size of the metal winding in the second direction is substantially the wiring width, which is H. Being limited to be routed in the wiring layer to form the winding, H and W may satisfy the following relationship: H>5 W. Such the winding method of the metal winding on the wiring layer is generally referred to as vertical winding of the wiring layer metal winding. Even if the respective wiring layers are connected by a via, since the wiring layers are perpendicular to the magnetic column and the via is perpendicular to the wiring layers, the via is necessarily parallel to the magnetic column. As a result, the via hardly crosslinks the magnetic flux. At the same time, assumed that the wiring layer metal winding of the vertical winding structure is a ring in the horizontal direction, and the width of the ring is H, it can be seen that with the vertical winding structure, the impedance of the outer part of the ring of the metal winding away from the magnetic column may be different from the impedance of the inner part of the ring close to the magnetic column due to the reasons such as the inconsistency of the inner and outer side circumferential length. And this will result in inconsistency of the inner and outer ring impedance of the wiring layer metal winding, thereby causing the problem of non-uniform distribution of the current flowing through during the application.

FIG. 28 is a structural schematic diagram of a transformer module. For convenience of description, in the schematic diagram, the shape of the winding, and the positional relationship between the winding and the magnetic core are specifically drawn, but the disclosure is not limited thereto. If multiple wiring layers need to be provided, an insulating layer and a new wiring layer can be sequentially added outside the wiring layer. With reference to FIG. 28, the dimension of the winding parallel to the longitudinal direction of the magnetic column is defined as W, and the thickness of the winding which is the dimension of the winding vertical to the magnetic column of the magnetic core is H. When H and W satisfy the relationship: W>10H, we define this winding manner of the winding as a winding having a foil structure. Generally, the winding shown in FIG. 28 is made by a copper foil process that is the winding is made of copper foil by cutting or punching process. And in this structure, the output connectors of the winding, e.g. 21 and 22 are almost stretched out from the sides of the winding to connect to the circuits (not shown). The output connectors are always centralized, which means very few of the connectors (e.g. only two connectors for each winding in FIG. 28) are used to connect to the circuit. The very few of the connectors stretching out from the sides of the winding makes the uneven current distribution on the joint part of the connectors and the other part of the winding. In addition, centralized output connectors always have long length. Thus the loss of the connectors is large.

SUMMARY

Embodiments of the present application provide a transformer module and a power module. For a winding included in the transformer module, the equivalent diameters of respective parts are similar, and the equivalent impedance is similar, so that the distribution of the current flowing through the winding during the application is more uniform.

In a first aspect, an embodiment of the present application provides a transformer module, including:
- a magnetic core, including at least one magnetic column being at least partially covered by a multi-layer carrier, wherein the multi-layer carrier includes a plurality of horizontal copper foils and a plurality of connecting copper foils, each of the horizontal copper foils is located on a horizontal wiring layer, and the connecting copper foil is disposed to connect the horizontal copper foils located on different horizontal wiring layers; and
- a first winding and a second winding surrounding the magnetic column, and the second winding being located outside the first winding;
- where the first winding includes at least two horizontal copper foils of the plurality of the horizontal copper foils and at least two connecting copper foils of the plurality of the connecting copper foils; the second winding includes at least two horizontal copper foils of the plurality of the horizontal copper foils and at least two connecting copper foils of the plurality of the connecting copper foils;
- a first end of the first winding is electrically connected to a first surface-mounted pin; a second end of the first winding is electrically connected to a second surface-mounted pin;
- a first end of the second winding is electrically connected to a third surface-mounted pin; a second end of the second winding is electrically connected to a fourth surface-mounted pin;
- the first surface-mounted pin, the second surface-mounted pin, the third surface-mounted pin and the fourth surface-mounted pin are disposed on at least one surface of the transformer module.

In one possible design, the transformer module further includes a third winding, where the third winding includes at least two horizontal copper foils of the plurality of the horizontal copper foils and at least two connecting copper foils of the plurality of the connecting copper foils, and the third winding is located outside the second winding;
- a first end of the third winding is electrically connected to a fifth surface-mounted pin;
- a second end of the third winding is electrically connected to the second surface-mounted pin, and the first surface-mounted pin, the second surface-mounted pin, and the fifth surface-mounted pin are disposed on a surface of the transformer module; or
- a second end of the third winding is electrically connected to a sixth surface-mounted pin, and the first surface-mounted pin, the second surface-mounted pin, the fifth surface-mounted pin and the sixth surface-mounted pin are disposed on the at least one surface of the transformer module.

In one possible design, the multi-layer carrier includes a first horizontal wiring layer, a first insulating layer and a second horizontal wiring layer which are sequentially disposed, the first insulating layer is located between the first horizontal wiring layer and the second horizontal wiring layer, and forms an accommodating groove to accommodate at least part of the magnetic column;
- the horizontal copper foils of the first winding include a first copper foil and a second copper foil, the connecting copper foils of the first winding include a third copper foil and a fourth copper foil; the first copper foil is disposed on the first horizontal wiring layer, and the first copper foil includes a first segment and a second segment spaced apart from each other to respectively form the first end and the second end of the first winding; the second copper foil is disposed on the second horizontal wiring layer; the third copper foil and the fourth copper foil are disposed to pass through the first insulating layer; the first copper foil, the second copper foil, the third copper foil and the fourth copper foil are connected to each other and surround the accommodating groove.

In one possible design, the multi-layer carrier further includes a third horizontal wiring layer and a fourth horizontal wiring layer; the first horizontal wiring layer and the third horizontal wiring layer are located on a first side of the first insulating layer, and the third horizontal wiring layer is located outside the first horizontal wiring layer; the second horizontal wiring layer and the fourth horizontal wiring layer are located on a second side of the first insulating layer, and the fourth horizontal wiring layer is located outside the second horizontal wiring layer;
- a second insulating layer is disposed between the first horizontal wiring layer and the third horizontal wiring layer, and a third insulating layer is disposed between the second horizontal wiring layer and the fourth horizontal wiring layer;
- the horizontal copper foils of the second winding include a fifth copper foil and a sixth copper foil, the connecting copper foils of the second winding include a seventh copper foil and an eighth copper foil; the fifth copper foil is disposed on the third horizontal wiring layer, and includes a third segment and a fourth segment spaced apart from each other to respectively form the first end and the second end of the second winding; the sixth copper foil is disposed on the fourth horizontal wiring layer; the fifth copper foil, the sixth copper foil, the seventh copper foil and the eighth copper foil are connected to each other and surround the accommodating groove.

In one possible design, the multi-layer carrier further includes a fifth horizontal wiring layer and a sixth horizontal wiring layer; the fifth horizontal wiring layer and the third horizontal wiring layer are located on the first side of the first insulating layer, and the fifth horizontal wiring layer is located outside the third horizontal wiring layer; the sixth horizontal wiring layer and the fourth horizontal wiring layer are located on the second side of the first insulating layer, and the sixth horizontal wiring layer is located outside the fourth horizontal wiring layer;
- a fourth insulating layer is disposed between the fifth horizontal wiring layer and the third horizontal wiring layer, and a fifth insulating layer is disposed between the sixth horizontal wiring layer and the fourth horizontal wiring layer;
- the horizontal copper foils of the third winding include a ninth copper foil and a tenth copper foil, the connecting copper foils of the third winding include an eleventh copper foil and a twelfth copper foil; the ninth copper foil is disposed on the fifth horizontal wiring layer, the tenth copper foil is disposed on the sixth horizontal wiring layer, and the ninth copper foil includes a fifth segment and a sixth segment spaced apart from each other to respectively form the first end and the second end of the third winding; the ninth copper foil, the tenth copper foil, the eleventh copper foil and the twelfth copper foil are connected to each other and surround the accommodating groove.

In one possible design, the multi-layer carrier further includes a first carrier and a second carrier;
- where the first carrier and the second carrier are oppositely disposed; the first carrier includes a first horizontal wiring layer, a first insulating layer and a second horizontal wiring layer which are sequentially disposed, the second carrier includes a third horizontal wiring layer, a second insulating layer and a fourth horizontal wiring layer which are sequentially disposed; the first horizontal wiring layer is in contact with the third horizontal wiring layer, and an accommodating groove is formed in the first insulating layer and the second insulating layer to accommodate at least part of the magnetic column;

the horizontal copper foils of the first winding include a first copper foil and a fourth copper foil, the connecting copper foils of the first winding include a second copper foil, a third copper foil, a fifth copper foil and a sixth copper foil;

the first copper foil is disposed on the second horizontal wiring layer, and includes a first segment and a second segment spaced apart from each other to respectively form the first end and the second end of the first winding; the second copper foil and the third copper foil are disposed penetrating the first insulating layer and are both electrically connected to the first copper foil; the fourth copper foil is disposed on the fourth horizontal wiring layer, and the fifth copper foil and the sixth copper foil are disposed penetrating the second insulating layer and are both electrically connected to the fourth copper foil; the first copper foil, the second copper foil, the third copper foil, the fourth copper foil, the fifth copper foil and the sixth copper foil are connected to each other and surround the accommodating groove.

In one possible design, the first carrier further includes a third insulating layer and a fifth horizontal wiring layer outside the second horizontal wiring layer;

the second carrier further includes a fourth insulating layer and a sixth horizontal wiring layer outside the fourth horizontal wiring layer;

the horizontal copper foils of the second winding include a seventh copper foil and a tenth copper foil, and the connecting copper foils of the second winding include an eighth copper foil, a ninth copper foil, an eleventh copper foil and a twelfth copper foil;

where the seventh copper foil is located on the fifth horizontal wiring layer, and includes a third segment and a fourth segment spaced apart from each other to respectively form the first end and the second end of the second winding; the tenth copper foil is located on the sixth horizontal wiring layer; the seventh copper foil, the eighth copper foil, the ninth copper foil, the tenth copper foil, the eleventh copper foil and the twelfth copper foils are connected to each other and surround the accommodating groove.

In one possible design, the transformer module further includes a third winding, where the third winding includes at least two horizontal copper foils of the plurality of the horizontal copper foils and at least two connecting copper foils of the plurality of the connecting copper foils, and the third winding is located outside the second winding;

a first end of the third winding is electrically connected to a fifth surface-mounted pin;

a second end of the third winding is electrically connected to the second surface-mounted pin, and the first surface-mounted pin, the second surface-mounted pin and the fifth surface-mounted pin are disposed on a surface of the transformer module; or a second end of the third winding is electrically connected to a sixth surface-mounted pin, and the first surface-mounted pin, the second surface-mounted pin, the fifth surface-mounted pin and the sixth surface-mounted pin are disposed on the at least one surface of the transformer module;

the first carrier further includes a fifth insulating layer and a seventh horizontal wiring layer outside the fifth horizontal wiring layer;

the second carrier further includes a sixth insulating layer and an eighth horizontal wiring layer outside the sixth horizontal wiring layer;

the horizontal copper foils of the third winding include a thirteenth copper foil and a sixteenth copper foil, and the connecting copper foils of the third winding include a fourteenth copper foil, a fifteenth copper foil, a seventeenth copper foil and an eighteenth copper foil;

the thirteenth copper foil is located on the seventh horizontal wiring layer, and includes a fifth segment and a sixth segment spaced apart from each other to respectively form the first end and the second end of the third winding; the sixteenth copper foil is located on the eighth horizontal wiring layer; the thirteenth copper foil, the fourteenth copper foil, the fifteenth copper foil, the sixteenth copper foil, the seventeenth copper foil and the eighteenth copper foils are connected to each other and surround the accommodating groove.

In one possible design, the second winding is a spiral multi-turn winding surrounding the magnetic column formed by etching the fifth copper foil, the sixth copper foil, the seventh copper foil and the eighth copper foil.

In one possible design, the first end of the first winding is electrically connected to the first surface-mounted pin through a first via, the second end of the first winding is electrically connected to the second surface-mounted pin through a second via; the first end of the second winding is electrically connected to the third surface-mounted pin through a third via, the second end of the second winding is electrically connected to the fourth surface-mounted pin through a fourth via.

In one possible design, there are a plurality of the fifth surface-mounted pins, and the plurality of the fifth surface-mounted pins are located between the first surface-mounted pin and the second surface-mounted pin.

In one possible design, the first surface-mounted pin further includes a plurality of toothed portions, and the plurality of the toothed portions are staggered with a plurality of the fifth surface-mounted pins.

In one possible design, there is one fifth surface-mounted pin, and the fifth surface-mounted pin is located between the first surface-mounted pin and the second surface-mounted pin.

In one possible design, the at least one magnetic column includes a first magnetic column and a second magnetic column; a horizontal copper foil of an outermost winding surrounding the first magnetic column is disposed adjacent to a horizontal copper foil of an outermost winding surrounding the second magnetic column, and the adjacent horizontal copper foils are connected by a common connecting copper foil.

In one possible design, a transition layer is formed on a surface of the magnetic column by spraying, dipping, electrophoresis, electrostatic spraying, chemical vapor deposition, physical vapor deposition or evaporation with an insulating material, and the first winding is formed on the transition layer.

In one possible design, the second winding is a multi-turn winding, and a connecting copper foil included in each turn of the multi-turn winding is waist-shaped hole copper.

In one possible design, at least one waist-shaped hole is disposed between a first side of the fifth copper foil and a first side of the sixth copper foil, an inner surface of each of the at least one waist-shaped hole forms first waist-shaped hole copper, and the first waist-shaped hole copper forms the seventh copper foil; and at least one waist-shaped hole is disposed between a second side of the fifth copper foil and a second side of the sixth copper foil, an inner surface of each of the at least one waist-shaped hole forms second waist-shaped hole copper, and the second waist-shaped hole copper forms the eighth copper foil.

In one possible design, the first side of the fifth copper foil and the first side of the sixth copper foil do not protrude from an outer edge of the seventh copper foil; and the second side of the fifth copper foil and the second side of the sixth copper foil do not protrude from an outer edge of the eighth copper foil.

In one possible design, from a first preset temperature to a second preset temperature, an equivalent coefficient of thermal expansion of an insulating layer between the first winding and the magnetic column is higher than an equivalent coefficient of thermal expansion of an insulating layer between the first winding and the second winding; or a decomposition temperature of an insulating layer between the first winding and the magnetic column is 170° C.-260° C.; or a low-melting-point material is disposed between the magnetic column and an insulating layer between the first winding and the magnetic column, and a melting temperature of the low-melting-point material is lower than 200° C.

In one possible design, the transformer module further includes an exhaust passage disposed to penetrate a portion between a surface of the magnetic column and a surface of the transformer module.

In a second aspect, an embodiment of the present application provides a transformer module, including:

a magnetic core, including at least one magnetic column being at least partially covered by a multi-layer carrier; and a first winding and a second winding surrounding the magnetic column;

wherein the multi-layer carrier includes a first horizontal wiring layer, a first insulating layer, a second horizontal wiring layer, a second insulating layer, a third horizontal wiring layer, a third insulating layer and a fourth horizontal wiring layer, wherein the first insulating layer is located between the first horizontal wiring layer and the second horizontal wiring layer, and part of the first insulating layer forms an accommodating groove to accommodate at least part of the magnetic column; the second insulating layer is located between the first horizontal wiring layer and the third horizontal wiring layer; and the third insulating layer is located between the second horizontal wiring layer and the fourth horizontal wiring layer;

the first winding includes a first copper foil, a second copper foil, a third copper foil, a fourth copper foil, a fifth copper foil, a sixth copper foil and a seventh copper foil, which surround the accommodating groove and are electrically connected, wherein the first copper foil is located on the first horizontal wiring layer, the third copper foil is located on the second horizontal wiring layer, the fifth copper foil is located on the fourth horizontal wiring layer, and the seventh copper foil is located on the third horizontal wiring layer; the second copper foil is disposed to pass through the first insulating layer and connect the first copper foil and the third copper foil; the fourth copper foil is disposed to pass through the third insulating layer and connect the third copper foil and the fifth copper foil; the sixth copper foil is disposed to pass through the first insulating layer, the second insulating layer and the third insulating layer, and connect the fifth copper foil and the seventh copper foil;

the second winding includes an eighth copper foil, a ninth copper foil, a tenth copper foil, an eleventh copper foil, a twelfth copper foil, a thirteenth copper foil and a fourteenth copper foil, which surround the accommodating groove and are electrically connected, wherein the eighth copper foil is located on the first horizontal wiring layer, the tenth copper foil is located on the second horizontal wiring layer, the twelfth copper foil is located on the fourth horizontal wiring layer, and the fourteenth copper foil is located on the third horizontal wiring layer; and the ninth copper foil is disposed to pass through the first insulating layer and connect the eighth copper foil and the tenth copper foil; the eleventh copper foil is disposed to pass through the third insulating layer and connect the tenth copper foil and the twelfth copper foil; the thirteenth copper foil is disposed to pass through the first insulating layer, the second insulating layer and the third insulating layer, and connect the twelfth copper foil and the fourteenth copper foil;

the first winding includes a first end and a second end, and the second winding includes a third end and a fourth end;

a first surface-mounted pin, a second surface-mounted pin, a third surface-mounted pin and a fourth surface-mounted pin are located on at least one surface of the transformer module, the first end of the first winding is electrically connected to the first surface-mounted pin, the second end of the first winding is electrically connected to the second surface-mounted pin, the third end of the second winding is electrically connected to the third surface-mounted pin, and the fourth end of the second winding is electrically connected to the fourth surface-mounted pin.

In one possible design, the transformer module includes a third winding;

the multi-layer carrier further includes a fifth horizontal wiring layer and a sixth horizontal wiring layer, wherein the fifth horizontal wiring layer is located between the first horizontal wiring layer and the third horizontal wiring layer, and the sixth horizontal wiring layer is located between the second horizontal wiring layer and the fourth horizontal wiring layer; the third winding includes a fifteenth copper foil, a sixteenth copper foil, a seventeenth copper foil and an eighteenth copper foil, which surround the accommodating groove and are electrically connected, wherein the fifteenth copper foil is located on the fifth horizontal wiring layer, the seventeenth copper foil is located on the sixth horizontal wiring layer, and the fifteenth copper foil includes a fifth segment and a sixth segment, the fifth segment of the fifteenth copper foil is electrically connected to a fifth surface-mounted pin, the sixth segment of the fifteenth copper foil is electrically connected to a sixth surface-mounted pin; and the fifth surface-mounted pin and the sixth surface-mounted pin are located on the at least one surface of the transformer module.

In one possible design, the second surface-mounted pin and the forth surface-mounted pin are the same surface-mounted pin, and the first surface-mounted pin, the second surface-mounted pin and the third surface-mounted pin are located on a surface of the transformer module.

In one possible design, the transformer module further includes a first switching device and a second switching device, wherein the first switching device and the second switching device each include a first end and a second end;
 the first winding further has a first interval to form a first breakpoint and a second breakpoint, the first breakpoint is electrically connected to the first end of the first switching device, and the second breakpoint is electrically connected to the second end of the first switching device;
 the second winding further has a second interval to form a third breakpoint and a fourth breakpoint, the third breakpoint is electrically connected to the first end of the second switching device, and the fourth breakpoint is electrically connected to the second end of the second switching device; and
 the first surface-mounted pin and the third surface-mounted pin are the same pin.

In one possible design, the multi-layer carrier further includes a first carrier and a second carrier;
 the transformer module further includes a seventh horizontal wiring layer and an eighth horizontal wiring layer which are located in the first insulating layer and in contact with each other;
 the first carrier includes the first horizontal wiring layer, the third horizontal wiring layer, the second insulating layer, the seventh horizontal wiring layer and part of the first insulating layer;
 the second carrier includes the second horizontal wiring layer, the fourth horizontal wiring layer, the third insulating layer, the eighth horizontal wiring layer and part of the first insulating layer;
 wherein the first carrier and the second carrier form the multi-layer carrier by contacting between the seventh horizontal wiring layer and the eighth horizontal wiring layer.

In one possible design, there are a plurality of the third surface-mounted pins, the first surface-mounted pin further includes a plurality of toothed portions, and the plurality of the toothed portions are staggered with the plurality of the third surface-mounted pins.

In one possible design, there are a plurality of the first surface-mounted pins and a plurality of the third surface-mounted pins, and the plurality of the first surface-mounted pin are staggered with the plurality of the third surface-mounted pins.

In one possible design, there is one third surface-mounted pin, and the third surface-mounted pin is located between the first surface-mounted pin and the second surface-mounted pin.

In one possible design, the at least one magnetic column includes a first magnetic column and a second magnetic column; a horizontal copper foil of an outermost winding surrounding the first magnetic column is disposed adjacent to a horizontal copper foil of an outermost winding surrounding the second magnetic column, and the adjacent horizontal copper foils are connected by a common connecting copper foil.

In one possible design, a transition layer is formed on a surface of the magnetic column by spraying, dipping, electrophoresis, electrostatic spraying, chemical weather deposition, physical weather deposition or evaporation with an insulating material; the first copper foil, the second copper foil and the third copper foil in the first winding are formed on the transition layer, and the eighth copper foil, the ninth copper foil and the tenth copper foil in the second winding are formed on the transition layer.

In one possible design, the third winding is a multi-turn winding, and a connecting copper foil included in each turn of the multi-turn winding is waist-shaped hole copper.

In one possible design, at least one waist-shaped hole is disposed between a first side of the fifteenth copper foil and a first side of the seventeenth copper foil, an inner surface of each of the at least one waist-shaped hole forms first waist-shaped hole copper, and the first waist-shaped hole copper forms the sixteenth copper foil; and
 at least one waist-shaped hole is disposed between a second side of the fifteenth copper foil and a second side of the seventeenth copper foil, an inner surface of each of the at least one waist-shaped hole forms second waist-shaped hole copper, and the second waist-shaped hole copper forms the eighteenth copper foil.

In one possible design, the first side of the fifteenth copper foil and the first side of the seventeenth copper foil do not protrude from an outer edge of the sixteenth copper foil; and the second side of the fifteenth copper foil and the second side of the seventeenth copper foil do not protrude from an outer edge of the eighteenth copper foil.

In one possible design, the transformer module includes an inner insulating layer and an outer insulating layer;
 an equivalent coefficient of thermal expansion of the inner insulating layer from a first preset temperature to a second preset temperature is higher than an equivalent coefficient of thermal expansion of the outer insulating layer from the first preset temperature to the second preset temperature; or
 a decomposition temperature of the inner insulating layer is 170° C.-260° C.; or
 a low-melting-point material is disposed between the inner insulating layer and the magnetic column, and a melting temperature of the low-melting-point material is lower than 200° C.

In one possible design, the transformer module further includes an exhaust passage disposed to penetrate a portion between a surface of the magnetic column and a surface of the transformer module.

In a third aspect, an embodiment of the present application provides a power module, including:
 a transformer module according to any of the first aspect and the possible designs of the first aspect; and
 a switching module, wherein the switching module is in contact with the transformer module and electrically connected to the first surface-mounted pin and the second surface-mounted pin.

In one possible design, the switching module includes a switch carrier and at least one power switch, the power switch is disposed on the switch carrier, and the power switch is electrically connected to the first surface-mounted pin and/or the second surface-mounted pin.

In one possible design, the power module further includes a capacitor module, the capacitor module is disposed on the switch carrier and adjacent to the transformer module, and the capacitor module is electrically connected to the first surface-mounted pin.

In one possible design, the transformer module further includes a third winding electrically connected to the first winding, the power module further includes a first power switch and a second power switch, wherein a first end of the first power switch is electrically connected to the second surface-mounted pin, a first end of the second power switch is electrically connected to the third winding, and a second end of the first power switch is electrically connected to a second end of the second power switch.

Since the winding in the present application covers a plurality of surfaces of the magnetic column through the horizontal copper foils and the connecting copper foils of the multi-layer carrier, the equivalent diameters of respective parts of the winding in the present application are similar, and the equivalent impedance is similar, so that the distribution of the winding current during the application is more uniform. Moreover, the windings in the present application are not formed by foil winding using an independent copper foil, but are formed by horizontal copper foils on the horizontal wiring layers of the multi-layer carrier and connecting copper foils for connecting the horizontal wiring layers. The formation of the winding is convenient and flexible, avoiding the problem that it is inconvenient to form the winding by foil winding using the copper foil.

BRIEF DESCRIPTION OF DRAWINGS

FIG. 6' is a third schematic structural diagram of a transformer module provided by an embodiment of the present application.

FIG. 7' is a third circuit diagram of a transformer module provided by an embodiment of the present application.

FIG. 9' is a fifth bottom view of a transformer module provided by an embodiment of the present application.

DETAILED DESCRIPTION OF EMBODIMENTS

In the prior art, one way of implementing a transformer for the low-voltage and high-current application is to use a wiring layer metal winding with a vertical winding structure. In this case, the plane on which a PCB is located is perpendicular to a magnetic column, and a winding is formed by the spiral change of the routing in the wiring layer on the single plane, which results in the inconsistency of the inner and outer side impedance of the wiring layer metal winding, thereby causing the problem of non-uniform current distribution.

While for the transformer with the foil winding structure in the prior art, the centralized output connectors of the winding are almost stretched out from the sides of the winding to connect to the circuits, which results in the uneven current distribution on the joint part of the connectors and the other part of the winding. And since the centralized output connectors stretch out from sides of the windings, they always have long length. Thus the loss of the connectors is large.

Figure 28:
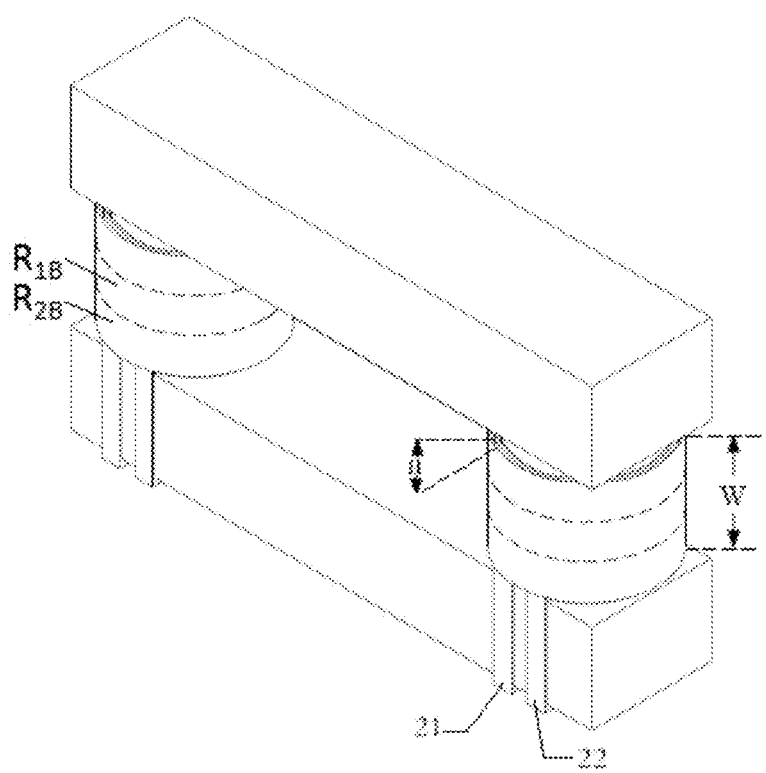
FIG. 28 is another structural schematic diagram of a transformer module provided by the prior art.

As described above, the winding shown in FIG. 28 is generally made of copper foil by cutting or punching process. Due to the limitation of the copper foil winding itself, a piece of copper foil can only be winded surrounding one magnetic column, but cannot be conveniently connected in a plurality of magnetic columns at the same time. In order to solve these technical problems, the present application provides a transformer module and a power module.

It should be noted that the "horizontal" in the following embodiments is only one direction set for convenience of description, and is not limited to the horizontal line direction in practical use. The illustration of the length of the straight line of the horizontal wiring layer being longer than that of the horizontal copper foil in the figures described below is only for the purpose of understanding and facilitating the labeling. In practice, the length of the horizontal wiring layer of the transformer module may not be longer than that of the horizontal copper foil.

Figure 1:
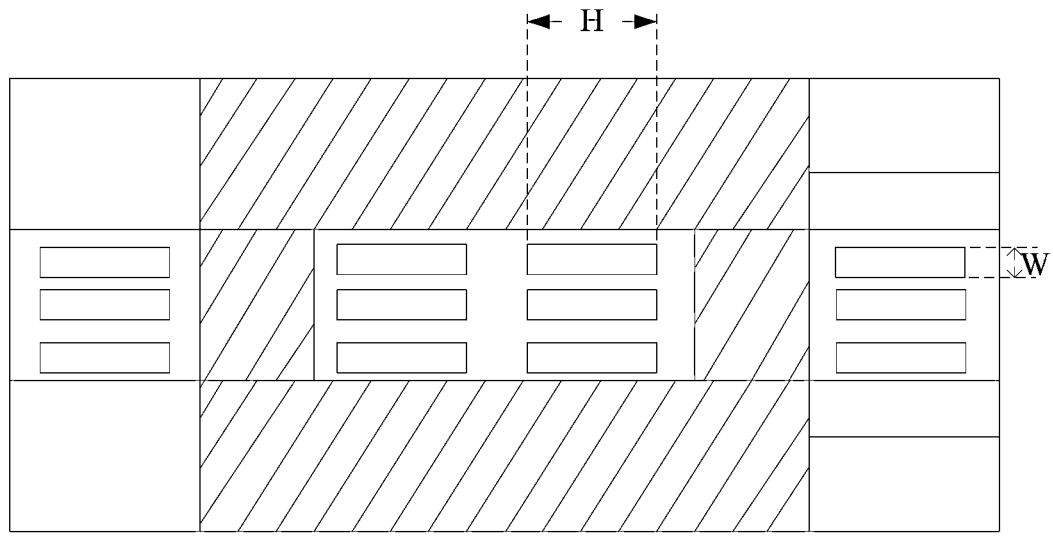
FIG. 1 is a side view of a transformer using a multi-layer PCB provided by the prior art.
Figure 2:
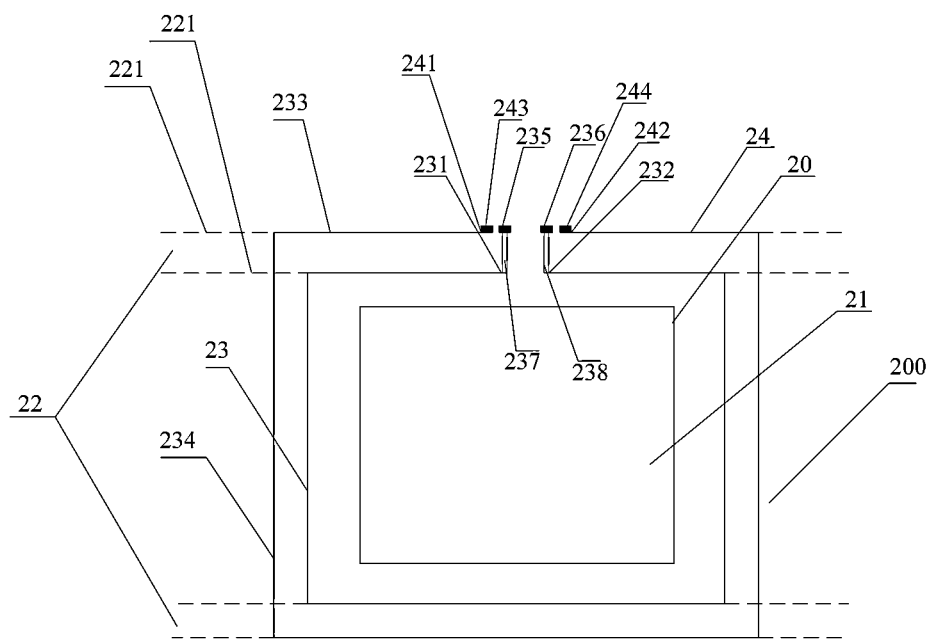
FIG. 2 is a first schematic structural diagram of a transformer module provided by an embodiment of the present application.
Figure 3:
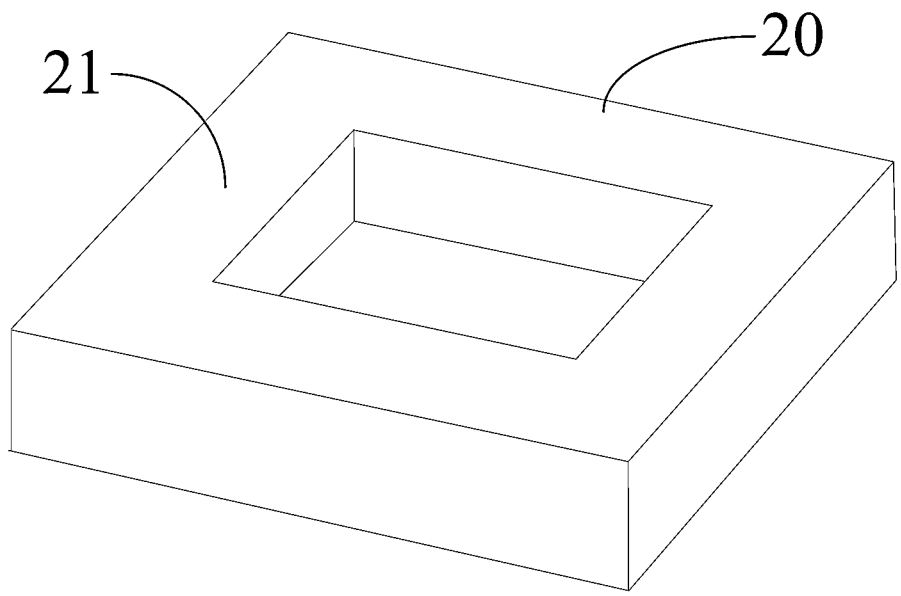
FIG. 3 is a first schematic structural diagram of a magnetic core provided by an embodiment of the present application.
Figure 4:
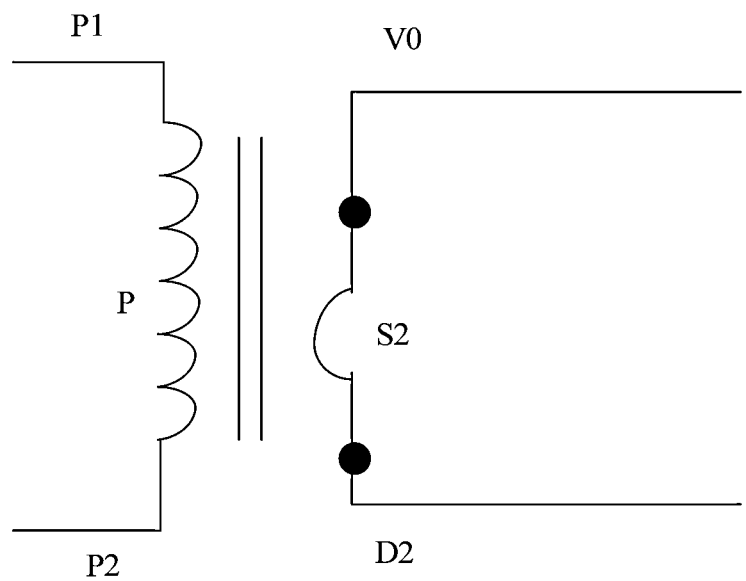
FIG. 4 is a first circuit diagram of a transformer module provided by an embodiment of the present application.
Figure 5:
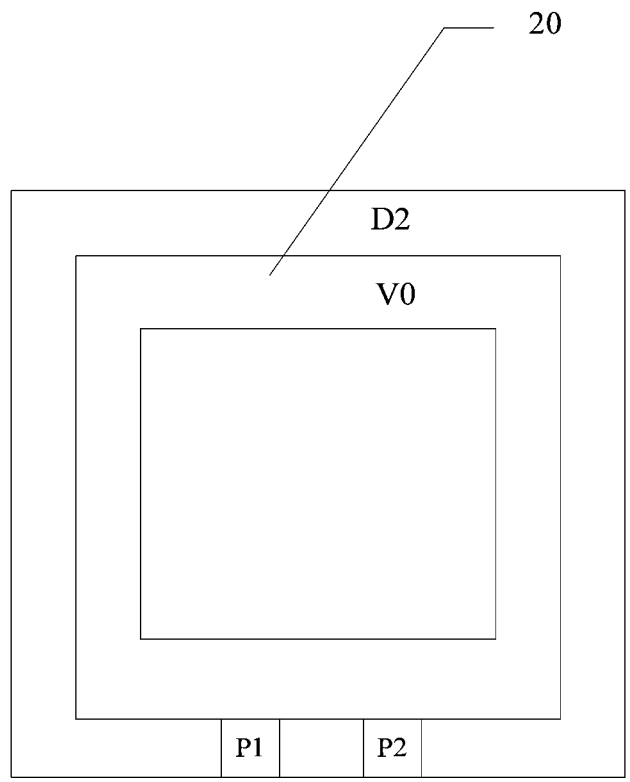
FIG. 5 is a first bottom view of a transformer module provided by an embodiment of the present application.

FIG. 2 is a first schematic structural diagram of a transformer module provided by an embodiment of the present application, FIG. 3 is a first schematic structural diagram of a magnetic core 20 provided by an embodiment of the present application, FIG. 4 is a first circuit diagram of a transformer module provided by an embodiment of the present application, and FIG. 5 is a first bottom view of a transformer module provided by an embodiment of the present application. Referring to FIG. 2 to FIG. 5, the transformer module 200 of this embodiment includes:

a magnetic core 20 including at least one magnetic column 21, the magnetic column 21 is at least partially covered by a multi-layer carrier 22, the multi-layer carrier 22 includes a plurality of horizontal copper foils 233 and a plurality of connecting copper foils 234; wherein the horizontal copper foils 233 can be located on a horizontal wiring layer 221, and the connecting copper foils 234 are disposed to connect two horizontal copper foils; if the horizontal wiring layer has a horizontal copper foil, then at least one horizontal copper foil is disposed on the horizontal wiring layer. The magnetic core 20 may only have its one magnetic column 21 covered by the multi-layer carrier 22, or the entire magnetic core 20 may be covered by the multi-layer carrier, so that a winding surrounding the magnetic column can be formed in the multi-layer carrier 22, which is not limited.

The magnetic core 20 in this embodiment has a "□" shape, a ring shape, an I shape or a C shape, and the magnetic core 20 shown in FIG. 3 is a square magnetic core. The present application does not limit the shape of the magnetic core 20.

The multi-layer carrier 22 may be a multi-layer PCB, and the multi-layer PCB includes a plurality of wiring layers, and an insulating layer formed of an insulating material is disposed between adjacent two wiring layers. For example, the insulating material is FR4, and the wiring layer may be referred to as a horizontal wiring layer. The multi-layer carrier 22 may also be a multi-layer ceramic substrate including a plurality of wiring layers, and an insulating layer formed of an insulating material is disposed between adjacent two wiring layers. Of course, the multi-layer carrier 22 may also be other types of multi-layer board/substrate, such as a metal core composite PCB substrate, an IMS multi-layer substrate, a rigid-soft combined multi-layer board, an HDI board, and the like.

Optionally, the multi-layer carrier 22 may be a carrier that includes a plurality of wiring layers and a plurality of insulating layers.

Optionally, the multi-layer carrier 22 may also be composed of a plurality of carriers. For example, the multi-layer carrier 22 includes the first carrier and the second carrier which are oppositely disposed. And each of the plurality carriers include a plurality of wiring layers and a plurality of insulating layers.

The transformer module 200 of this embodiment further includes a first winding 23 and a second winding 24 which surround the magnetic column 21. The second winding 24 is located outside the first winding 23, which means the distance between the winding 24 and the column 21 is larger than that between the winding 23 and the magnetic column 21. Further, the second winding 24 located outside the first winding 23 also means the second winding 24 at least partially covers the first winding 23. And the first and second windings are both windings having a foil structure. The second winding 24 at least partially covers the first winding 23, which can improve the coupling coefficient and greatly reduce the leakage inductance between windings.

The first winding 23 and the second winding 24 are both formed by at least two horizontal copper foils of the plurality of horizontal copper foils and at least two connecting copper foils of the plurality of connecting copper foils. The reference number 233 in FIG. 2 is a horizontal copper foil of the plurality of horizontal copper foils, and the reference number 234 in FIG. 2 is a connecting copper foil of the plurality of connecting copper foils. It can be understood that the windings in this embodiment may not be limited to being foil winded surrounding one magnetic column 21. In some embodiments, one winding may be foil winded surrounding a plurality of magnetic columns 21 of the magnetic core 20 or surrounding a plurality of surfaces of the magnetic core 20, and it is only required that part of the surfaces is formed with a pin for connecting an external circuit.

In this embodiment, the first winding 23 includes horizontal copper foils on the two horizontal wiring layers, the horizontal copper foils on the two horizontal wiring layers are connected by connecting copper foils to form the first winding 23; the second winding 24 includes horizontal copper foils on two horizontal wiring layers, and the horizontal copper foils on the two horizontal wiring layers are connected by connecting copper foils to form the second winding 24. The first and second windings are both windings in a foil structure.

Figure 6:
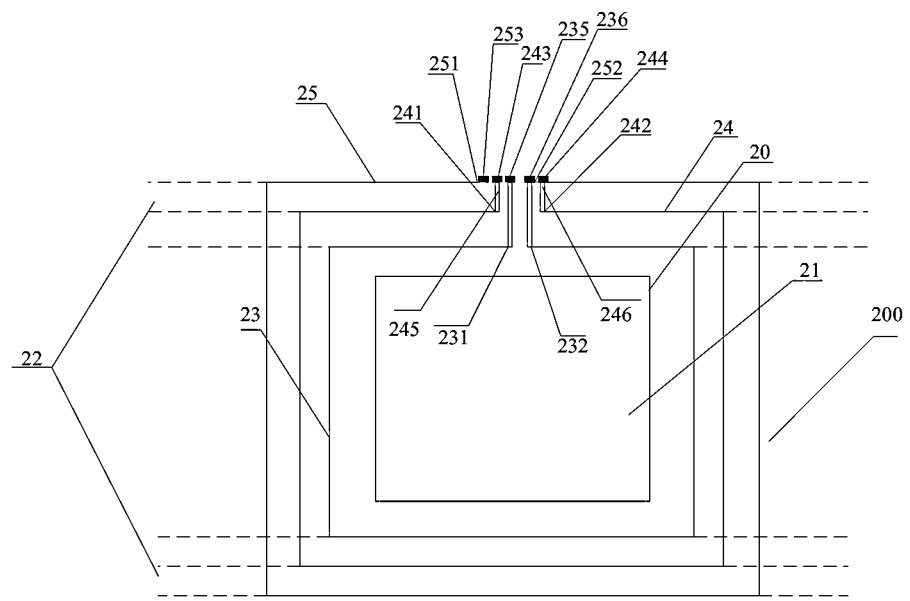
FIG. 6 is a second schematic structural diagram of a transformer module provided by an embodiment of the present application.
Figure 6:
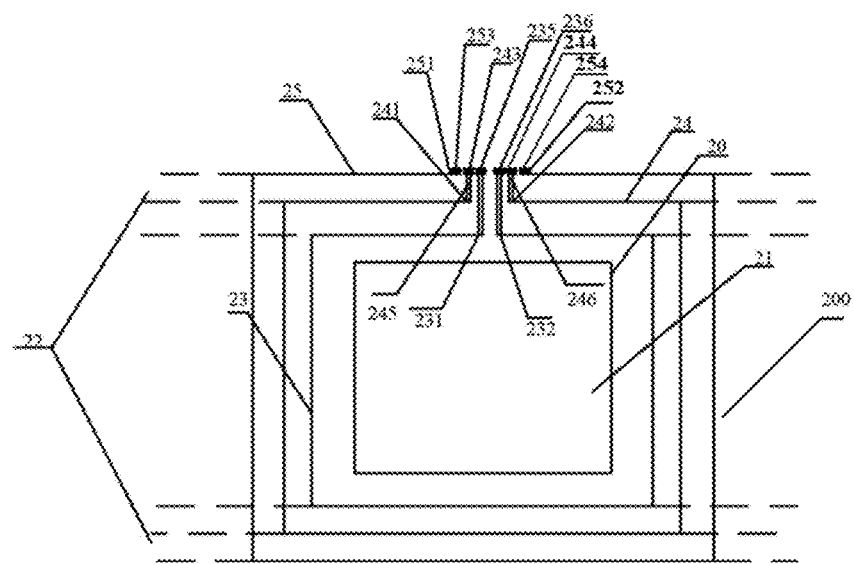

As shown in FIG. 2, when the second winding is located on the outer layer, a first end 241 of the second winding 24 forms a third surface-mounted pin 243, and a second end 242 of the second winding 24 forms a fourth surface-mounted pin 244. When the second winding is located on the inner layer, as shown in FIG. 6, the first end of the second winding can also be electrically connected to the third surface-mounted pin 243 through a third via 245, the second end of the second winding can also be electrically connected to the fourth surface-mounted pin 244 through a fourth via 246, and the position of the second winding is not limited to FIG. 2. Similarly, when the first winding 23 is located on the inner layer, as shown in FIG. 2, a first end 231 of the first winding can also be electrically connected to a first surface-mounted pin 235 through a first via 237, a second end of the first winding can also be electrically connected to a second surface-mounted pin 236 through a second via 238. The first and second vias pass through the insulation layer between the first winding 23 and the second winding 24.

The first surface-mounted pin 235, the second surface-mounted pin 236, the third surface-mounted pin 243 and the fourth surface-mounted pin are disposed on at least one surface of the transformer module 200. Moreover, in one embodiment, the first surface-mounted pin 235, the second surface-mounted pin 236, the third surface-mounted pin 243, and the fourth surface-mounted pin 244 can respectively correspond to terminals P1, P2, D2, and V0 in FIG. 4, which is not limited in the present application.

Specifically, referring to FIG. 4, the first winding 23 of this embodiment can serve as a primary winding P of a transformer in the transformer module, and the second winding 24 can serve as a secondary winding S2. It can be understood that in other embodiments, the first winding 23 can serve as the secondary winding S2 of the transformer in the transformer module, and the second winding 24 can serve as the primary winding P; when other windings are provided as the primary winding, both the first winding 23 and the second winding 24 can serve as the secondary windings, which is not limited in the present application. When the first winding 23 is the secondary winding S2 and the second winding 24 is the primary winding P, the first surface-mounted pin 235 connected to the first end 231 of the first winding 23 can serve as the terminal D2, and the second surface-mounted pin 236 connected to the second end 232 of the first winding 23 can serve as the surface-mounted pin V0.

The third surface-mounted pin 243 connected to the first end 241 of the second winding 24 can serve as the terminal P1, and the fourth surface-mounted pin 244 connected to the second end 242 of the second winding 24 can serve as the terminal P2.

Further, when the first winding 23 in this embodiment is the primary winding, the first winding 23 may be a multi-turn winding, and the second winding 24 may be a single-turn winding. Of course, when the first winding is the secondary winding, the first winding may also be a single-turn winding, and the second winding 24 may be a multi-turn winding, which is not limited. It can be understood that each turn in the winding can include a first horizontal copper foil, a second horizontal copper foil, a first connecting copper foil and a second connecting copper foil, wherein the first connecting copper foil and the second connecting copper foil connect the first horizontal copper foil and the second horizontal copper foil to form a single-turn coil surrounding the magnetic column; the first horizontal copper foils of respective turns may be located on the same horizontal wiring layer, and the second horizontal copper foils may be located on the same horizontal wiring layer, but they may also be located on different horizontal wiring layers, which is not limited.

Therefore, since each part of each turn of the winding in this embodiment is formed in a manner of covering the magnetic column, that is to say winding in a foil structure, their equivalent diameters with respect to the axis of the magnetic column are similar, so the equivalent impedance thereof is similar, and when it is used in a specific circuit, the distribution of the current flowing through the winding is more uniform. Moreover, the output connectors of the windings in this embodiment, that is, the vias and the pins are not stretched from the sides of the windings so that the loss caused by the uneven current distribution and long length of the connectors are reduced greatly. Furthermore, the windings in this embodiment are not formed by a copper foil process, but are formed by horizontal copper foils on the horizontal wiring layer of the multi-layer carrier 22 and connecting copper foils for connecting the horizontal wiring layers. The formation of the winding is more flexible, avoiding the problem caused by foil winding using the copper foil process.

Exemplary, if the multi-layer carrier 22 is a multi-layer PCB, the horizontal copper foils of the horizontal wiring layers may be formed by a PCB process, and the connecting copper foils for connecting the horizontal wiring layers can also be formed by a via process of the PCB. For example, different horizontal wiring layers of the PCB may be penetrated by punching holes, and copper is electroplated in the holes to form a vertical connecting copper foil.

The transformer module is connected to the external circuit through the first surface-mounted pin 235, the second surface-mounted pin 236, the third surface-mounted pin 243 and the fourth surface-mounted pin 244. The first surface-mounted pin 235, the second surface-mounted pin 236, the third surface-mounted pin 243 or the fourth surface-mounted pin 244 may have various shapes such as a column shape or a ball shape.

The first surface-mounted pin 235, the second surface-mounted pin 236, the third surface-mounted pin 243 and the fourth surface-mounted pin 244 are all located on the surfaces of the transformer module.

Optionally, the first surface-mounted pin 235, the second surface-mounted pin 236, the third surface-mounted pin 243 and the fourth surface-mounted pin 244 are all located on a first surface (for example, a bottom surface) of the transformer module.

Optionally, the first surface-mounted pin 235, the second surface-mounted pin 236, the third surface-mounted pin 243 and the fourth surface-mounted pin 244 are located on different surfaces of the transformer module. For example, the first surface-mounted pin 235 and the second surface-mounted pin 236 may be located on the first surface of the transformer module, the third surface-mounted pin 243 and the fourth surface-mounted pin 244 may be located on a second surface of the transformer module, wherein the first surface and the second surface are different.

The connecting copper foil in embodiments of the present application will be described below.

Specifically, the connecting copper foil may be formed by performing a surface metallization process on a hole-groove perpendicular to the horizontal wiring layer.

The surface metallization process is electroplating, chemical plating, and the like.

Based on this, for the transformer module in this embodiment, the equivalent diameter of each part of the winding covering the magnetic column is similar, and the equivalent impedance is similar, so that the winding current distribution is more uniform during the application, and the formation of the windings is convenient and flexible.

It should be noted that FIG. 2 only shows an example of the transformer module. In fact, the transformer module may further include a third winding, which is not limited in the present application. For example, the structure of the transformer module will be described below by taking the transformer module including three windings as an example.

Figure 7:
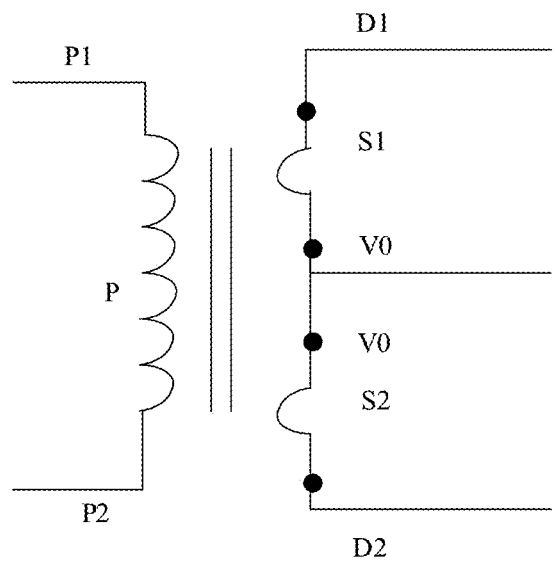
FIG. 7 is a second circuit diagram of a transformer module provided by an embodiment of the present application.
Figure 7:
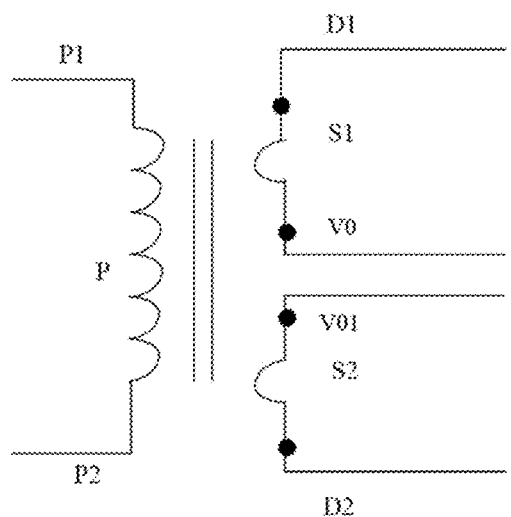
Figure 8A:
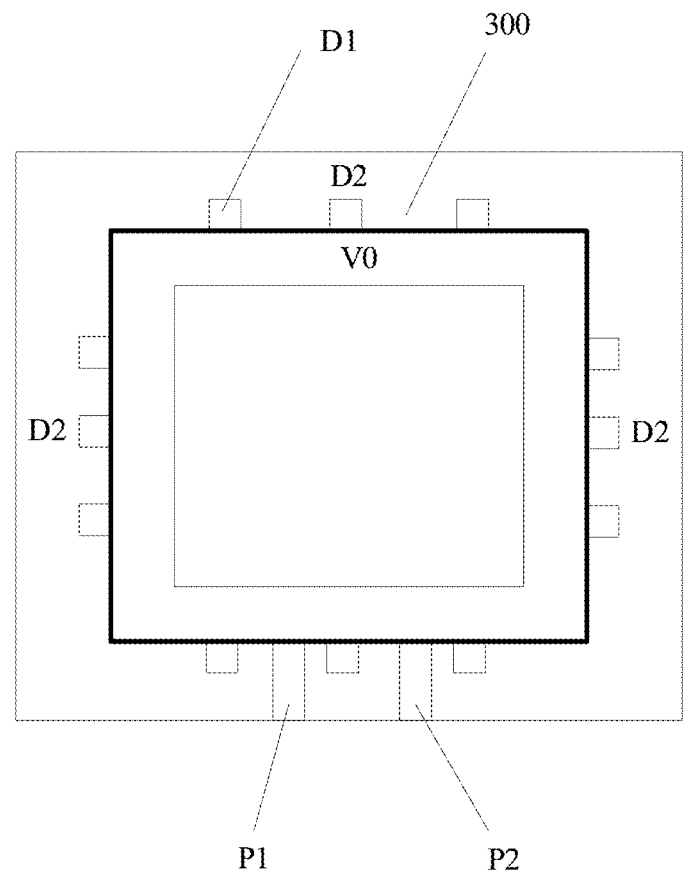
FIG. 8A is a second bottom view of a transformer module provided by an embodiment of the present application.
Figure 8B:
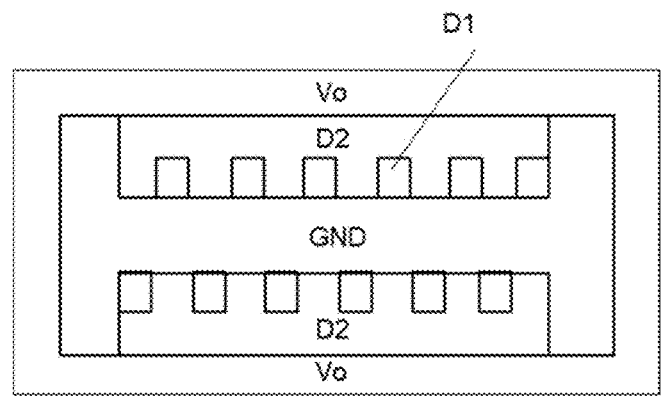
FIG. 8B is a third bottom view of a transformer module provided by an embodiment of the present application.
Figure 9:
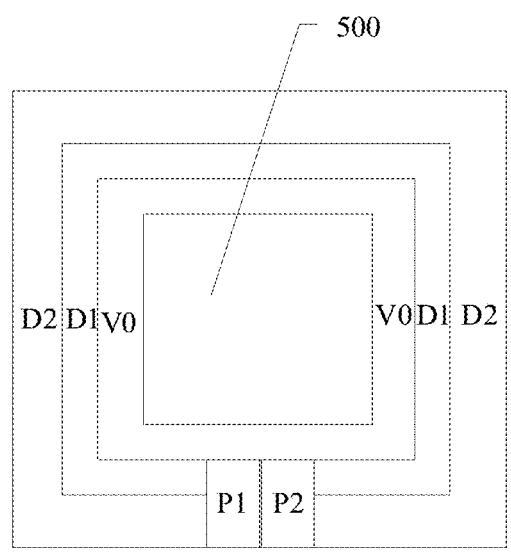
FIG. 9 is a fourth bottom view of a transformer module provided by an embodiment of the present application.
Figure 9:
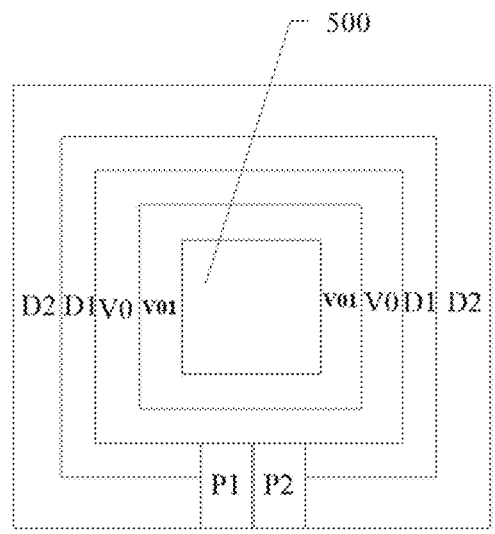

FIG. 6 is a second schematic structural diagram of a transformer module provided by an embodiment of the present application, FIG. 7 is a second circuit diagram of a transformer module provided by an embodiment of the present application, FIG. 8A is a second bottom view of a transformer module provided by an embodiment of the present application, FIG. 8B is a third bottom view of a transformer module provided by an embodiment of the present application, and FIG. 9 is a fourth bottom view of a transformer module provided by an embodiment of the present application. Referring to FIG. 6 to FIG. 9, the transformer module of this embodiment further includes a third winding 25 on the basis of the transformer module shown in FIG. 2.

As shown in FIG. 7, a transformer in this embodiment includes three windings: a primary winding P, a secondary winding S1 and a secondary winding S2. The primary winding P includes two terminals P1 and P2, the secondary winding S1 includes two terminals D1 and V0, the secondary winding S2 includes two terminals D2 and V0, and the two secondary windings are connected in series to the terminal V0.

FIG. 6 is a structural view of the inside of the transformer corresponding to FIG. 7. As shown in FIG. 6, a plurality of windings 23, 24, 25 are winded surrounding the magnetic core 21. The third winding 25 is added in FIG. 6 based on the structure of FIG. 2. The third winding 25 is formed by horizontal copper foils and connecting copper foils in the multi-layer carrier 22; the third winding 25 is located outside the second winding 24. Further, the second winding 24 located outside the first winding 23 also means the second winding 24 at least partially covers the first winding 23.

Specifically, referring to FIG. 6, the first winding 23 of the transformer module of this embodiment is the first secondary winding S2 of the transformer, the second winding 24 is the primary winding P of the transformer, and the third winding 25 is the second secondary winding S1 of the transformer. The first end 231 of the first winding 23 is electrically connected to the first surface-mounted pin 235, and the second end 232 is electrically connected to the second surface-mounted pin 236; and the first and second ends 231, 232 connect to the corresponding pins by connectors e.g. vias passing through the insulation layers between the first winding and third winding and the wiring layer where the second winding lay on. The first end 241 of the second winding 24 is electrically connected to the third surface-mounted pin 243, and the second end 242 is electrically connected to the fourth surface-mounted pin 244 and the first and second ends 241, 242 connect to the corresponding pins by connectors e.g. vias passing through the insulation layers between the second winding and third winding. A first end 251 of the third winding 25 at the outer layer forms a fifth surface-mounted pin 253, and a second end 252 of the third winding 25 forms the second surface-mounted pin 236. Since the connectors are stretched out not from the sides of the winding shown in FIG. 28 but by passing through the insulation layers between windings or even the wiring layer between windings, the length of the connectors reduce greatly. So the loss of the connectors reduces greatly too. In this embodiment, the first surface-mounted pin 235, the second surface-mounted pin 236 and the fifth surface-mounted pin correspond to the terminals D2, V0 and D1 shown in FIG. 7, respectively. Similar to FIG. 2, the windings of the inner layer can be connected to the surface-mounted pins of the outer layer through vias, for example, the first end of the second winding can also be electrically connected to the third surface-mounted pin 243 through the third via 245, and the second end of the second winding can also be electrically connected to the fourth surface-mounted pin 244 through the fourth via 246. The first surface-mounted pin 235 and the second surface-mounted pin 236 may be located on the first surface of the transformer module; the third surface-mounted pin 243 and the fourth surface-mounted pin 244 may be located on the first surface of the transformer module or on other sides of the transformer module. The first surface-mounted pin 235, the second surface-mounted pin 236, the third surface-mounted pin 243 and the fourth surface-mounted pin 244 are disposed on the same surface or different surfaces of the transformer module; the first surface-mounted pin 235, the second surface-mounted pin 236 and the fifth surface-mounted pin 253 are disposed on the same surface of the transformer module, for example, on the first surface of the transformer module.

In another embodiment, the first end 251 of the third winding 25 forms the fifth surface-mounted pin 253, and the second end 252 of the third winding 25 forms the sixth surface-mounted pin 254 (as shown in FIG. 6'). The first winding 23 of the transformer module is the first secondary winding S2 of the transformer, the second winding 24 is the primary winding P of the transformer, and the third winding 25 is the second secondary winding S1 of the transformer. In this case, the first winding 23 and the third winding 25 are independently used without an interconnection relationship. The first surface-mounted pin 235, the second surface-mounted pin 236, the fifth surface-mounted pin 253 and the sixth surface-mounted pin 254 are disposed on the same surface or different surfaces of the transformer module. The position of the pins is not limited here, but can be set flexibly according to actual needs. In this embodiment, the first surface-mounted pin 235, the second surface-mounted pin 236, the fifth surface-mounted pin 253 and the sixth surface-mounted pin 254 correspond to the terminals D2, V0, D1 and V01 shown in FIG. 7'.

FIGS. 8A, 8B, 9 and 9' are bottom views of the transformer module showing the positional relationship of the surface-mounted pins disposed on the transformer. As shown in FIGS. 8A, 8B and 9, the first surface-mounted pin 235, the second surface-mounted pin 236 and the fifth surface-mounted pin 253 serve as the terminals D2, V0 and D1, and can be disposed on the same surface of the transformer module 200. As shown in FIG. 9', the first surface-mounted pin 235, the second surface-mounted pin 236, the fifth surface-mounted pin and the sixth surface-mounted pin 254 serve as the terminals D2, V0, D1 and V01 correspondingly, and can be disposed on the same surface or different surfaces of the transformer module 200.

In an optional manner, as shown in FIG. 8A, there are a plurality of the fifth surface-mounted pins serving as the terminal D1, and the plurality of the fifth surface-mounted pins are located between the first surface-mounted pin serving as the terminal D2 and the second surface-mounted pin serving as the terminal V0. Further, the first surface-mounted pin serving as the terminal D2 further includes a plurality of toothed portions 300, and the plurality of the toothed portions 300 are staggered with the plurality of the fifth surface-mounted pins. Optionally, the plurality of toothed portions 300 are evenly staggered with the plurality of the fifth surface-mounted pins. The use of the plurality of the fifth surface-mounted pins facilitates uniform current distribution and the plurality of the fifth surface-mounted pins can be used to connect multiple sets of external devices, helping to reduce impedance and increase integration.

Optionally, the fifth surface-mounted pin may be of a column shape or a ball shape, which is not limited in the present application.

In another optional implementation as shown in FIG. 8B, a surface-mounted pin serving as a terminal GND is added for connection with a switching device and an output capacitor of the secondary side of the transformer compared with FIG. 8A. Further, there are a plurality of the fifth surface-mounted pins serving as terminals D1, the first surface-mounted pin serving as terminal D2 further includes a plurality of toothed portions 300, and the plurality of the toothed portions 300 are staggered with the plurality of the fifth surface-mounted pins. Optionally, the plurality of the toothed portions 300 are evenly staggered with the plurality of the fifth surface-mounted pins.

In another optional implementation as shown in FIG. 9, there is one fifth surface-mounted pin serving as terminal D1, and the fifth surface-mounted pin is located between the first surface-mounted pin serving as terminal D2 and the second surface-mounted pin serving as terminal V0. The magnetic core 20 may include a through hole 500. The fifth surface-mounted pin partially surrounds the through hole 500, for example, in a C-shape, from the bottom view of the transformer module, the first surface-mounted pin is of a C-shape surrounding the through hole 500, and the second surface-mounted pin is of a C-shape partially surrounding the through hole 500. However, it is not limited in the present application. By adjusting the positions of the third surface-mounted pin and the fourth surface-mounted pin, the first surface-mounted pin, the second surface-mounted pin and the fifth surface-mounted pin may also form other shapes such as a "☐" shape surrounding the through hole.

Based on this, for the transformer module in this embodiment, the equivalent diameter of each part of the winding is similar, and the equivalent impedance is similar. The winding current distribution is uniform and the formation of the windings is convenient and flexible. And because the connectors are stretched out not from the sides of the winding shown in FIG. 28 but by passing through the insulation layers between windings or even the wiring layer between windings, and the pins are not concentrated but distributed on the surface of the transformer module e.g. as shown FIGS. 8A, 8B and 9, the current distribution of winding are more even than that in FIG. 28 with concentrated pins stretched out from the side of the winding.

In order to facilitate the following description, a magnetic column and a structure surrounding said magnetic column (including the first winding, or including the first winding and the second winding, or including the first winding, the second winding and the third winding) are called a magnetic column unit in the embodiments of the present application.

Embodiments shown in FIGS. 2 to 9 will be described in detail below using specific embodiments.

Based on the description of the above embodiments, the multi-layer carrier may be a single carrier, or may include the first carrier and the second carrier which are oppositely disposed. The implementation of the multi-layer carrier is not limited in the present application. Next, the first winding 23, the second winding 24 and the third winding 25 corresponding to the multi-layer carrier with the above two different structures, respectively, will be described.

First, the first winding 23, the second winding 24 and the third winding 25 corresponding to the multi-layer carrier that is a single carrier will be described.

Figure 10:
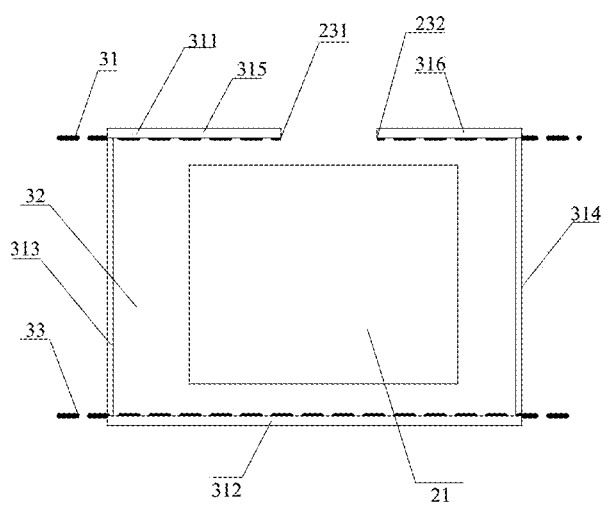
FIG. 10 is a first schematic structural diagram of a first winding provided by an embodiment of the present application.
Figure 11:
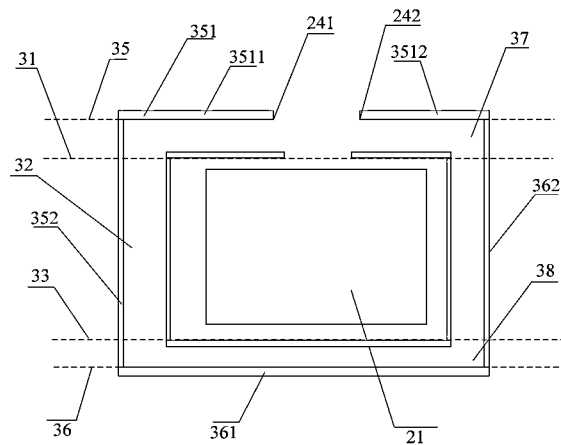
FIG. 11 is a first schematic structural diagram of a second winding provided by an embodiment of the present application.
Figure 12:
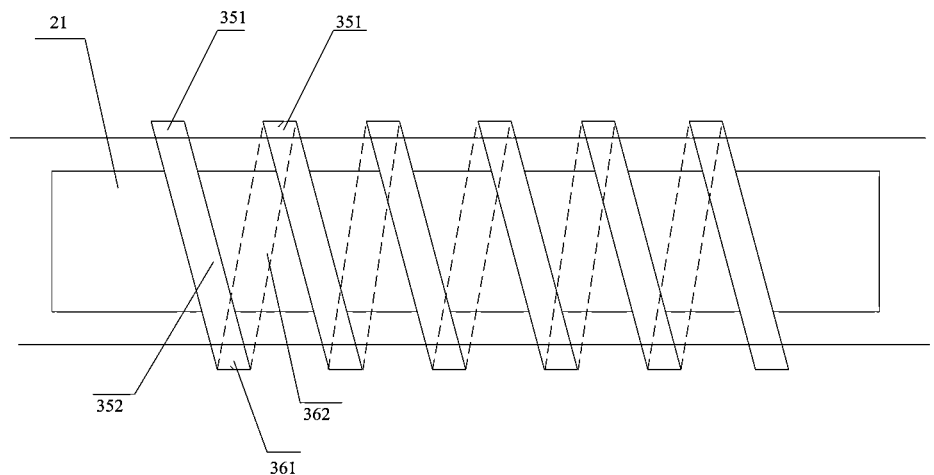
FIG. 12 is a second schematic structural diagram of a second winding provided by an embodiment of the present application.
Figure 13:
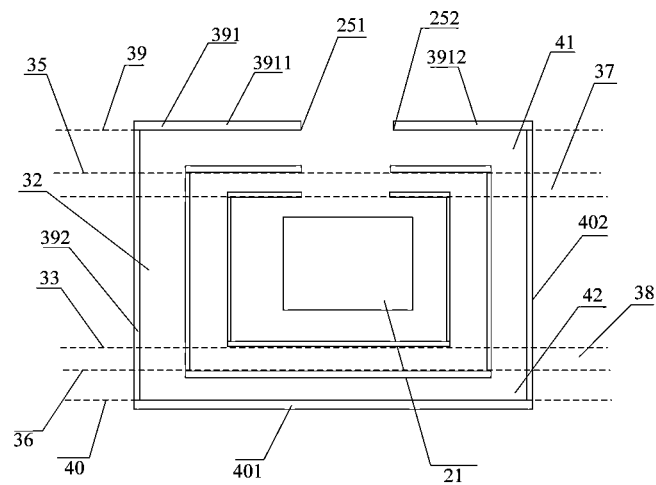
FIG. 13 is a first schematic structural diagram of a third winding provided by an embodiment of the present application.

FIG. 10 is a first schematic structural diagram of a first winding provided by an embodiment of the present application, FIG. 11 is a first schematic structural diagram of a second winding provided by an embodiment of the present application, FIG. 12 is a second schematic structural diagram of a second winding provided by an embodiment of the present application, and FIG. 13 is a first schematic structural diagram of a third winding provided by an embodiment of the present application.

Referring to FIG. 10, the multi-layer carrier in this embodiment includes a first horizontal wiring layer 31, a first insulating layer 32 and a second horizontal wiring layer 33 which are sequentially disposed. The first insulating layer 32 is located between the first horizontal wiring layer 31 and the second horizontal wiring layer 33, and forms an accommodating groove to accommodate at least part of the magnetic column 21.

The horizontal copper foils of the first winding 23 include a first copper foil 311 and a second copper foil 312, and the connecting copper foils of the first winding 23 include a third copper foil 313 and a fourth copper foil 314. The first copper foil 311 is disposed on the first horizontal wiring layer 31, and the first copper foil 311 includes a first segment 315 and a second segment 316 spaced apart from each other to form a first end 231 and a second end 232 of the first winding 23, respectively; the second copper foil 312 is disposed on the second horizontal wiring layer 33; the third copper foil 313 and the fourth copper foil 314 are disposed to pass through the first insulating layer 32; the first copper foil 311, the second copper foil 312, the third copper foil 313 and the fourth copper foil 314 are connected to each other and surround the magnetic column 21 in the accommodating groove. The winding in FIG. 10 is in a foil structure.

A possible formation process of the first winding shown in FIG. 10 will be described below.

The copper cladded on the first horizontal wiring layer 31 is etched to obtain the first copper foil 311 including the first segment 315 and the second segment 316 spaced apart from each other; and the copper cladded on the second horizontal wiring layer 33 obtains the second copper foil 312. The first insulating layer 32 between a first side of the first copper foil 311 and a first side of the second copper foil 312 is penetrated by punching a hole, and the hole is electroplated with copper to obtain the third copper foil 313. The first insulating layer 32 between a second side of the first copper foil 311 and a second side of the second copper foil 312 is penetrated by punching a hole, and the hole is electroplated with copper to obtain the fourth copper foil 314. The first side of the first copper foil 311 and the second side of the first copper foil 311 are opposite sides, and the first side of the second copper foil 312 and the second side of the second copper foil 312 are opposite sides, and the first side of the first copper foil 311 and the first side of the second copper foil 312 are on the same side of the magnetic column 21 which the first winding 23 surrounds.

The manner of the formation of the third copper foil 313 and the fourth copper foil includes, but is not limited to, the following two implementations.

Figure 27A:
FIG. 27A is a schematic diagram of a via provided by an embodiment of the present application.

One possible implementation is that: at least one row of vertical vias may be disposed between the first side of the first copper foil 311 and the first side of the second copper foil 312; each via is disposed penetrating or nearly penetrating the first insulating layer 32; a first end of the each via is connected to the first side of the first copper foil 311, and a second end of the each via is connected to the first side of the second copper foil 312; after copper cladding is performed on the inner surface of each via, the third copper foil 313 is formed. FIG. 27A is a schematic diagram of a via provided by an embodiment of the present application, and FIG. 27A shows a cross-sectional view of each row of vias.

It can be understood that the distance between two adjacent vias should be as small as possible.

At least one row of vertical vias may be disposed between the second side of the first copper foil 311 and the second side of the second copper foil 312; a first end of the each via is connected to the second side of the first copper foil 311, and a second end of the each via is connected to the second side of the second copper foil 312; after copper cladding is performed on the inner surface of each via, the fourth copper foil 314 is formed. It can be understood that the distance between two adjacent vias should be as small as possible.

Figure 27B:
FIG. 27B is a schematic diagram of a wiring trench provided by an embodiment of the present application.

Another possible implementation is that: a vertical wiring trench may be disposed between the first side of the first copper foil 311 and the first side of the second copper foil 312; a first end of the vertical wiring trench is connected to the first side of the first copper foil 311, and a second end of the vertical wiring trench is connected to the first side of the second copper foil 312; after copper cladding is performed on the inner surface of the vertical wiring trench, the third copper foil 313 is formed. FIG. 27B is a schematic diagram of a wiring trench provided by an embodiment of the present application, and FIG. 27B shows a cross-sectional view of the vertical wiring trench.

A vertical wiring trench may be disposed between the second side of the first copper foil 311 and the second side of the second copper foil 312; a first end of the vertical wiring trench is connected to the second side of the first copper foil 311, and a second end of the vertical wiring trench is connected to the second side of the second copper foil 312; after copper cladding is performed on the inner surface of the vertical wiring trench, the fourth copper foil 314 is formed.

Referring to FIG. 11, the multi-layer carrier further includes a third horizontal wiring layer 35 and a fourth horizontal wiring layer 36. The first horizontal wiring layer 31 and the third horizontal wiring layer 35 are located on a same side of the first insulating layer, and the third horizontal wiring layer 35 is located outside the first horizontal wiring layer 31; the second horizontal wiring layer 33 and the fourth horizontal wiring layer 36 are located on another side of the first insulating layer 32, and the fourth horizontal wiring layer 36 is located outside the second horizontal wiring layer 32.

A second insulating layer 37 is disposed between the first horizontal wiring layer 31 and the third horizontal wiring layer 35, and a third insulating layer 38 is disposed between the second horizontal wiring layer 33 and the fourth horizontal wiring layer 36.

The horizontal copper foils of the second winding 24 include a fifth copper foil 351 and a sixth copper foil 361, the connecting copper foils of the second winding 24 include a seventh copper foil 352 and an eighth copper foil 362; wherein the fifth copper foil 351 is disposed on the third horizontal wiring layer 35, and includes a third segment 3511 and a fourth segment 3512 spaced apart from each other to form the first end 241 and the second end 242 of the second winding 24, respectively; the sixth copper foil 361 is disposed on the fourth horizontal wiring layer 36; the fifth copper foil 351, the sixth copper foil 361, the seventh copper foil 352 and the eighth copper foil 362 are connected to each other and surround the accommodating groove.

It can be understood that, as described above, the second winding 24 can be used as a primary winding, which can be single-turn or multi-turn. The second winding 24 shown in FIG. 12 is a multi-turn winding. If the second winding 24 is a multi-turn winding, the second winding 24 is a spiral multi-turn winding surrounding the magnetic column 21 formed by etching the fifth copper foil 351, the sixth copper foil 361, the seventh copper foil 352 and the eighth copper foil 362.

A possible formation process of the second winding 24 shown in FIG. 11 will be described below. For the specific structure and implementation of the surface-mounted pin thereof, please refer to the foregoing drawings and corresponding description. Here, for convenience of description, the vias connected at both ends of the first winding and the respective surface-mounted pins are omitted.

The copper cladded on the third horizontal wiring layer 35 is etched to obtain the fifth copper foil 351 including the first segment and the second segment spaced apart from each other; the copper cladded on the fourth horizontal wiring layer 36 obtains the sixth copper foil 361; the layers between the third horizontal wiring layer 35 and the fourth horizontal wiring layer 36 are penetrated by punching a hole, and the hole is electroplated with copper to form the seventh copper foil 352 and the eighth copper foil 362; the fifth copper foil 351, the sixth copper foil 361, the seventh copper foil 352 and the eighth copper foil 362 are connected to each other to form the second winding 24.

The seventh copper foil 352 and the eighth copper foil 362 are formed in a similar manner to the third copper foil 313 and the fourth copper foil 314 shown in FIG. 10, which will not be repeated here.

Based on the above process, the second winding 24 is formed. The formation process of the second winding 24 is convenient and flexible; the equivalent diameter of each part of the second winding 24 is similar, the equivalent impedance is similar, and the winding current distribution is uniform.

Referring to FIG. 13, the multi-layer carrier further includes a fifth horizontal wiring layer 39 and a sixth horizontal wiring layer 40; the fifth horizontal wiring layer 39 and the third horizontal wiring layer 35 are located on a same side of the first insulating layer 32, and the fifth horizontal wiring layer 39 is located outside the third horizontal wiring layer 35; the sixth horizontal wiring layer 40 and the fourth horizontal wiring layer 36 are located on a same side of the first insulating layer 32, and the sixth horizontal wiring layer 40 is located outside the fourth horizontal wiring layer 36.

A fourth insulating layer 41 is disposed between the fifth horizontal wiring layer 39 and the third horizontal wiring layer 35, and a fifth insulating layer 42 is disposed between the sixth horizontal wiring layer 40 and the fourth horizontal wiring layer 36.

The horizontal copper foils of the third winding 25 include a ninth copper foil 391 and a tenth copper foil 401, the connecting copper foils of the third winding 25 include an eleventh copper foil 392 and a twelfth copper foil 402; the ninth copper foil 391 is disposed on the fifth horizontal wiring layer 39, the tenth copper foil 401 is disposed on the sixth horizontal wiring layer 40, and the ninth copper foil 391 includes a fifth segment 3911 and a sixth segment 3912 spaced apart from each other to form the first end 251 and the second end 252 of the third winding 25, respectively; the ninth copper foil 391, the tenth copper foil 401, the eleventh copper foil 392 and the twelfth copper foil 402 are connected to each other and surround the accommodating groove. For the specific structure and implementation of the surface-mounted pin thereof, please refer to the foregoing drawings and corresponding description. Here, for convenience of description, the vias connected at both ends of the first winding and the second winding, as well as the respective surface-mounted pins are omitted. The third winding is also a winding in a foil structure.

A possible formation process of the third winding 25 shown in FIG. 13 will be described below.

The copper cladded on the fifth horizontal wiring layer 39 is etched to obtain the ninth copper foil 391 including the fifth segment and the sixth segment spaced apart from each other; the copper cladded on the sixth horizontal wiring layer 40 obtains the tenth copper foil 401; the layers between the fifth horizontal wiring layer 39 and the sixth horizontal wiring layer 40 are penetrated by punching a hole, and the hole is electroplated with copper to form the eleventh copper foil 392 and the twelfth copper foil 402; the ninth copper foil 391, the tenth copper foil 401, the eleventh copper foil 392 and the twelfth copper foil 402 are connected to each other to form the third winding 25.

The eleventh copper foil 392 and the twelfth copper foil 402 are formed in a similar manner to the third copper foil 313 and the fourth copper foil 314 shown in FIG. 10, which will not be repeated here.

Based on the above process, the third winding 25 is formed. The formation process of the third winding 25 is convenient and flexible; the equivalent diameter of each part of the third winding 25 is similar, the equivalent impedance is similar, and the winding current distribution is uniform.

Figure 14A:
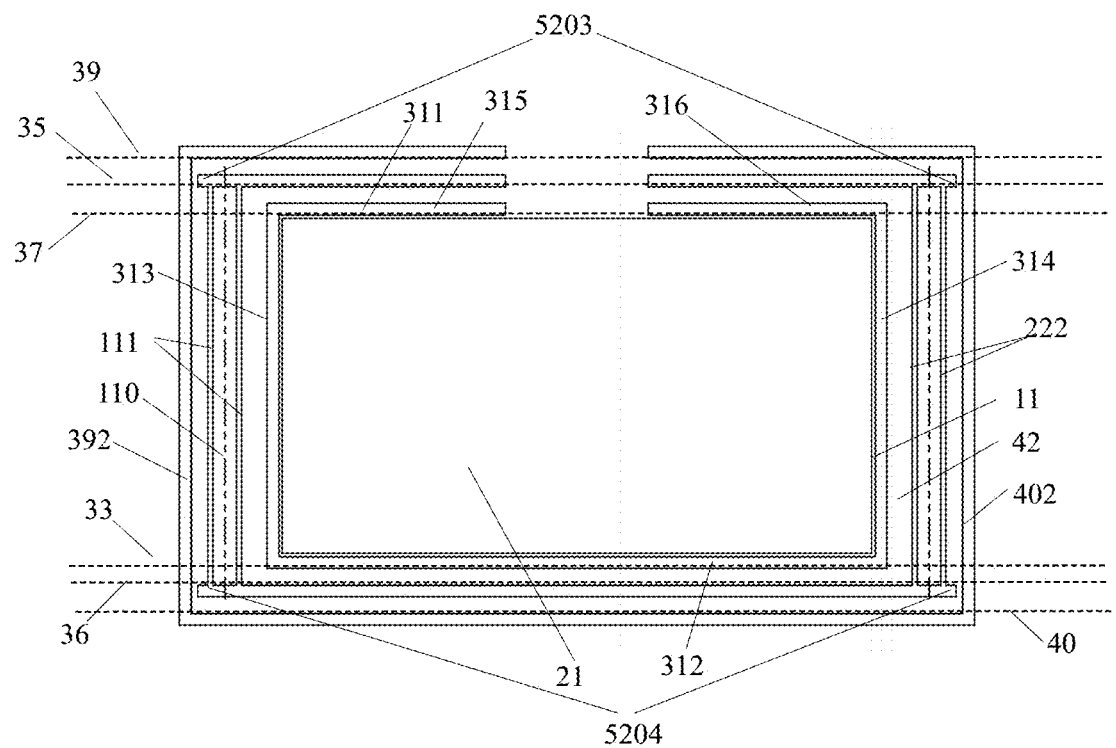
FIG. 14A is a first cross-sectional view of FIG. 13A.

In some embodiments, the first winding can also be obtained by laser etching. As shown in FIG. 14A, a transition layer is formed on the surface of the magnetic column, and the horizontal copper foils 311 and 312 as well as the connecting copper foils 313 and 314 of the first winding are directly formed on the transition layer by a metallization process. Compared with forming the connecting copper foils of the first winding by performing copper cladding on the via or performing copper cladding on the wiring trench, forming the connecting copper foils directly on the surface of the transition layer by the metallization process can reduce the overall size of the transformer. The multi-segment structure formed on the horizontal copper foils 311 can be obtained by laser etching. The specific process is as follows: in the first step, a transition layer 11 is formed on the surface of the magnetic column 21, for example, by spraying, dipping, electrophoresis, electrostatic spraying, chemical vapor deposition, physical vapor deposition, sputtering, evaporation or printing; in the second step, two horizontal copper foils 311 and 312 as well as two connecting copper foils 313 and 314 are formed on the transition layer 11 by the metallization process; in the third step, a first protective layer is formed on the outer side of the two horizontal copper foils 311 and 312 as well as the two connecting copper foils 313 and 314, specifically, the first protective layer (not shown) made of tin, tin alloy, gold or gold alloy can be formed by electroplating or chemical plating technology; in the fourth step, a portion of the first protective layer on the outer side of the horizontal copper foil 311 is removed by Laser direct writing technology, specifically, pattern defining is performed on the surface of the protective layer on the outer side of the horizontal copper foil 311 by the Laser direct writing technology, so as to expose a position on the horizontal copper foil 311 which needs to be etched; in the fifth step, the exposed portion of the horizontal copper foil 311 is etched to obtain the first segment 315 of the first copper foil 311 and the second segment 316 of the first copper foil.

Figure 14B:
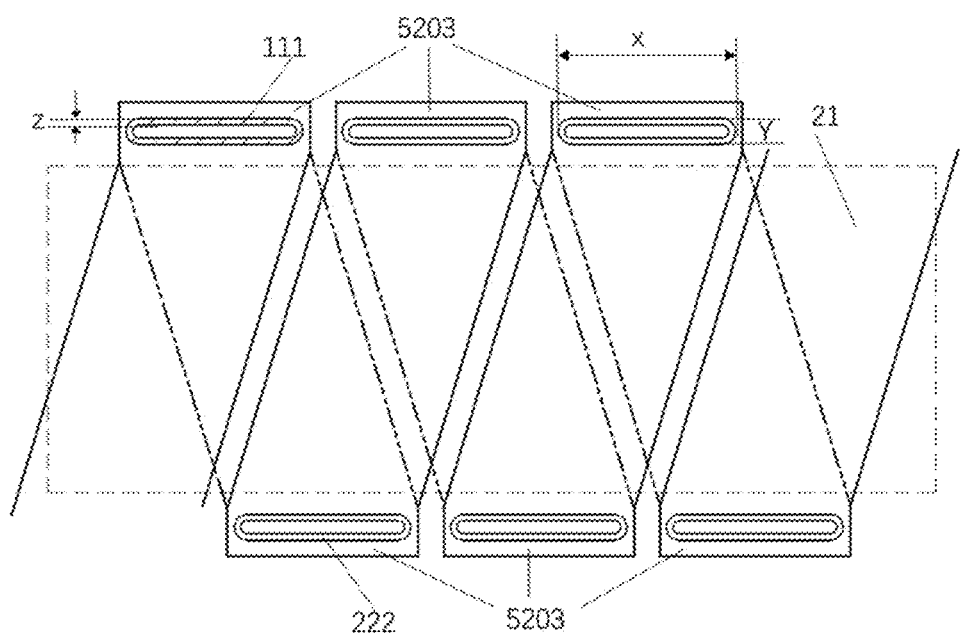
FIG. 14B is a top view of FIG. 14A.

In some embodiments, the second winding is a multi-turn winding, and the connecting copper foil included in each turn of the multi-turn winding is waist-shaped hole copper. In FIGS. 14A and 14B, the seventh copper foil and the eighth copper foil being waist-shaped hole copper is taken as an example for illustration. The formation of the waist-shaped hole copper may be that a waist-shaped hole is formed firstly, and then copper cladding is performed on the inner surface of the waist-shaped hole, thereby forming the waist-shaped hole copper shown as the slash-filled portion in FIG. 14B. However, the present invention is not limited to forming the connecting copper foils of the second winding (such as the seventh copper foil and the eighth copper foil) as waist-shaped hole copper, but the connecting copper foils in respective embodiments of the present application may be waist-shaped hole copper.

At least one waist-shaped hole can be disposed between the first side of the fifth copper foil 351 and the first side of the sixth copper foil 361, and each waist-shaped hole penetrates or nearly penetrates the first insulating layer 32, the second insulating layer 37 and the third insulating layer 38. The first end of each waist-shaped hole is connected to the first side of the fifth copper foil 351, and the second end of each waist-shaped hole is connected to the first side of the sixth copper foil 361. First waist-shaped hole copper 111 is formed after copper cladding is performed on the inner surface of each waist-shaped hole, and the first waist-shaped hole copper 111 forms the seventh copper foil.

At least one waist-shaped hole can be disposed between the second side of the fifth copper foil 351 and the second side of the sixth copper foil 361, and each waist-shaped hole penetrates or nearly penetrates the first insulating layer 32, the second insulating layer 37 and the third insulating layer 38. The first end of each waist-shaped hole is connected to the second side of the fifth copper foil 351, and the second end of each waist-shaped hole is connected to the second side of the sixth copper foil 361. Second waist-shaped hole copper 222 is formed after copper cladding is performed on the inner surface of each waist-shaped hole, and the second waist-shaped hole copper 222 forms the eighth copper foil.

Compared with the connecting copper foil formed by performing copper cladding on a row of vertical vias as shown in FIG. 27A, the waist-shaped hole copper 111 and 222 shown in FIGS. 14A and 14B which are formed by performing copper cladding on the waist-shaped holes provide a stronger through-current capability, since the copper surface area is increased. The first winding 23 and the third winding 25 in FIG. 14A can be the secondary winding of the transformer, the second winding 24 can be the primary winding of the transformer, and FIG. 14B is a top view of the second winding 24. As can be seen from FIGS. 14A and 14B, the third copper foil 313, the fourth copper foil 314, the eleventh copper foil 392 and the twelfth copper foil 402 are each a layer of copper foil; the seventh copper foil and the eighth copper foil are the waist-shaped hole copper 111 and 222; and the waist-shaped hole copper 111 and 222 connect the fifth copper foil 351 and the sixth copper foil 361. For example, in actual processing, the thickness of the third copper foil 313, the fourth copper foil 314, the eleventh copper foil 392 and the twelfth copper foil 402 may be set to 70 um, respectively; the thickness Z of each side of the waist-shaped hole copper 111, 222 may be set to 35 um, and the corresponding width Y of the waist-shaped hole 110 is set to 0.2 mm. The length X of the waist-shaped hole 110 should satisfy that X is greater than Y, which can be adjusted according to the number of turns and the size requirement, for example, letting $X/Y \geq 2$ or the like.

If the second winding is a multi-turn winding, then the number of each of the seventh copper foil and the eighth copper foil may be plural (as shown in FIG. 12). After the first winding is formed, a plurality of waist-shaped holes are formed on the insulating layer by a drilling process; then a plurality of waist-shaped hole copper are formed on the surface of each waist-shaped hole, which is exposed to the environment, by a metallization process, so as to obtain a plurality of connecting copper foils of the second windings; and the copper on the third horizontal wiring layer 35 and the fourth horizontal wiring layer 36 is etched to obtain a plurality of horizontal copper foils, so that the second winding having a multi-turn structure is formed.

The length X of the waist-shaped holes may be identical or different from each other. Different designs could be made according to the shape and size of the magnetic core. For example, the shape of the winding at the corner position of the end of the magnetic core is more irregular than the shape of the winding at the middle position, so the size of the waist-shaped hole set for the end may be different from the size of the waist-shaped hole at the middle position.

During the actual processing for forming a waist-shaped hole, since the electro-coppering and the mechanical punching have tolerances, it is necessary to make the third segment and the fourth segment of the fifth copper foil 351 as well as the sixth copper foil 361 protrude from the waist-shaped hole by a certain distance to form outer copper foils 5203 and 5204 for enveloping the processing tolerances. As shown in FIG. 14B, the first side and the second side of the fifth copper foil 351 protrude from the waist-shaped hole by a certain distance to form the outer copper foil 5203; the first side and the second side of the sixth copper foil 361 protrude from the waist-shaped hole by a certain distance to form the outer copper foil 5204. The waist-shaped hole copper 111, 222 (which are the seventh copper foil and the eighth copper foil) and the outer copper foils 5203, 5204 are obtained; and the hollow grooves of the waist-shaped holes surrounded by the hole copper 111, 222 are filled by a hole plugging process.

Figure 14C:
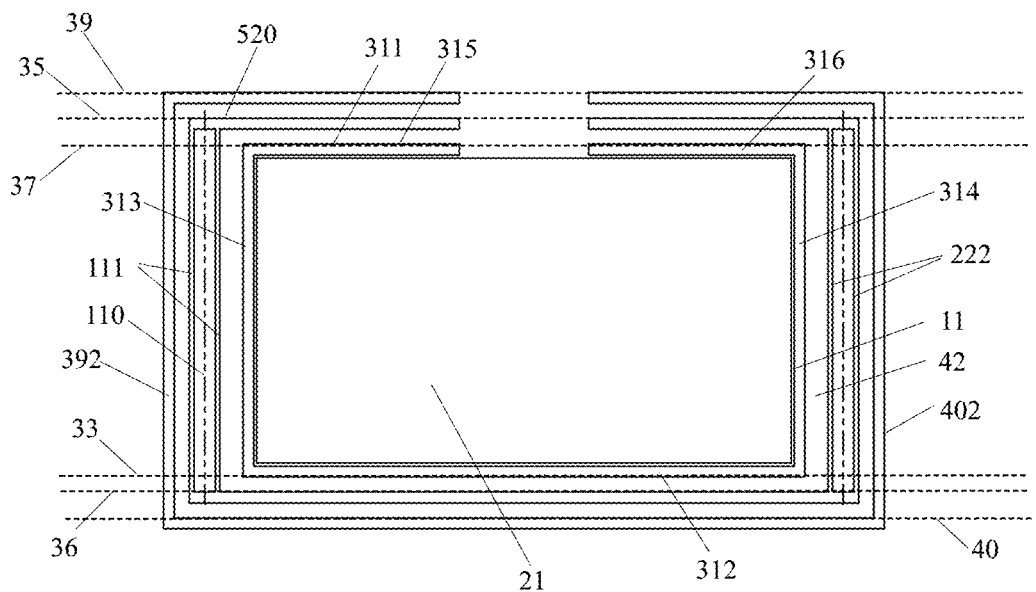
FIG. 14C is a second cross-sectional view of FIG. 13A.
Figure 14D:
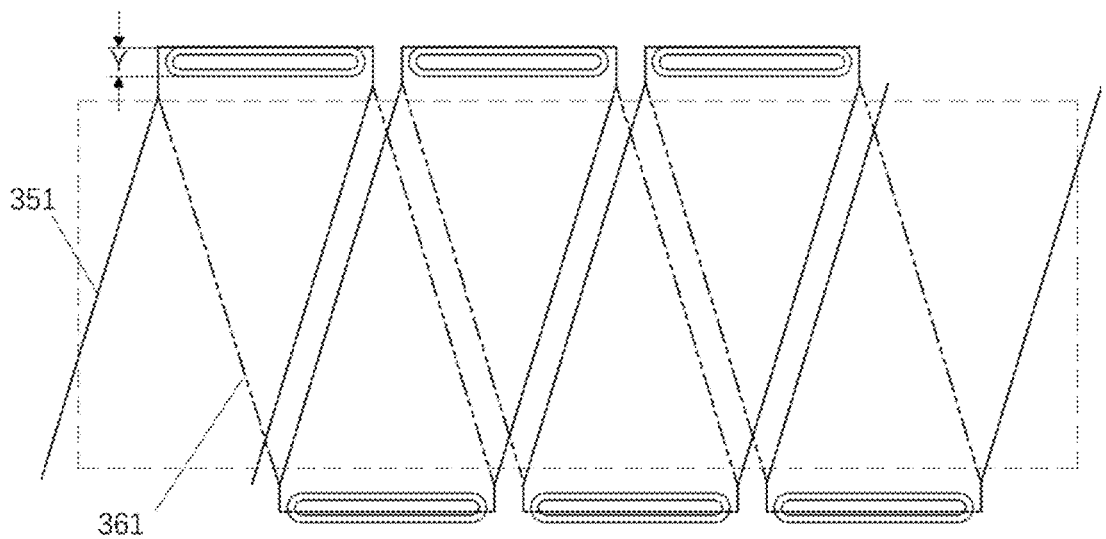
FIG. 14D is a top view of FIG. 14C.

In some embodiments, the outer copper foils 5203, 5204 of the fifth copper foil 351 and the sixth copper foil 361 can be etched away by a metallization process to form a structure as shown in FIG. 14C, and the top view of the structure is shown in FIG. 14D. The structure shown in FIG. 14C is different from that of FIG. 14A in that the formed fifth copper foil 351 and sixth copper foil 361 do not protrude from the waist-shaped hole, that is, the outer edge of the waist-shaped hole 110 away from the magnetic column, the first side of the fifth copper foil 351 and the first side of the sixth copper foil are flush, or the first side of the fifth copper foil 351 and the first side of the sixth copper foil are located on the inner side of the waist-shaped hole 110; the outer edge of the waist-shaped hole 110 away from the magnetic column, the second side of the fifth copper foil 351 and the second side of the sixth copper foil are flush, or the second side of the fifth copper foil 351 and the second side of the sixth copper foil are located on the inner side of the waist-shaped hole 110, thus there is no outer copper foils 5203 and 5204 described above. The outer edges of the fifth copper foil 351 and the sixth copper foil 361 are located within the range of the width Y of the waist-shaped hole in the width direction of the waist-shaped hole, that is, the following two features are given: the edge of the horizontal copper foil and the edge of the waist-shaped hole are flush, and the edge of the horizontal copper foil is located within the range of the width of the waist-shaped hole in the width direction of the waist-shaped hole. In the present application, the positional relationship between the inner side and the outer side follows the following principle: in the same structure, the position near the magnetic column is the inner side, and the position away from the magnetic column is the outer side.

The first winding in FIGS. 14A-14D may be the first winding in the embodiments in which the multi-layer carrier includes a single carrier, and may also be the first winding in the embodiments in which the multi-layer carrier includes two carriers. The second winding here may be the second winding in the embodiments in which the multi-layer carrier includes a single carrier, and may also be the second winding in the embodiments in which the multi-layer carrier includes two carriers. The third winding here may be the third winding in the embodiments in which the multi-layer carrier includes a single carrier, and may also be the third winding in the embodiments in which the multi-layer carrier includes two carriers.

Figure 18:
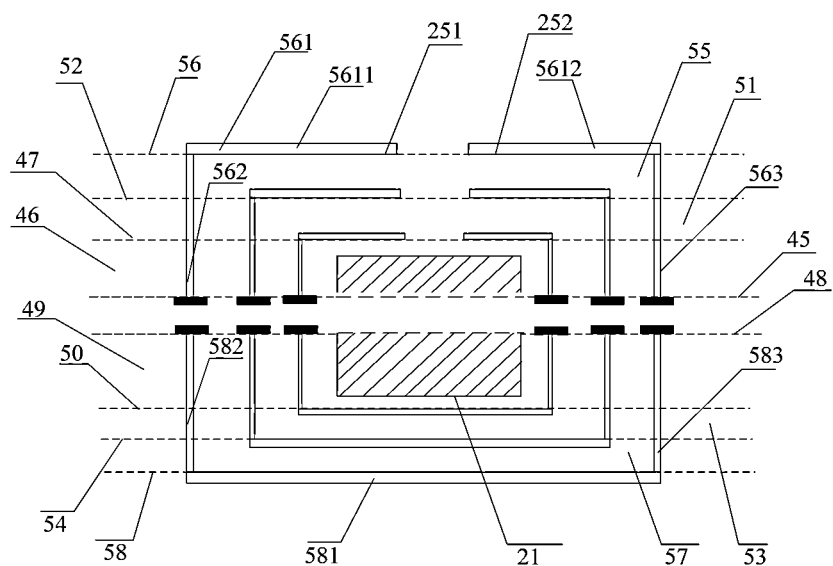
FIG. 18 is a second schematic structural diagram of a third winding provided by an embodiment of the present application.

The transformer module shown in FIG. 18 can also be formed by a method similar to that described above for forming the structure shown in FIG. 14D.

In some embodiments, the at least one magnetic column of the transformer module includes a first magnetic column and a second magnetic column. In this case, a horizontal copper foil of the outermost winding surrounding the first magnetic column is disposed adjacent to a horizontal copper foil of the outermost winding surrounding the second magnetic column, and the adjacent horizontal copper foils are connected by a common connecting copper foil. Further, the common connecting copper foil is waist-shaped hole copper, via cladding copper, or wiring trench cladding copper.

Figure 15:
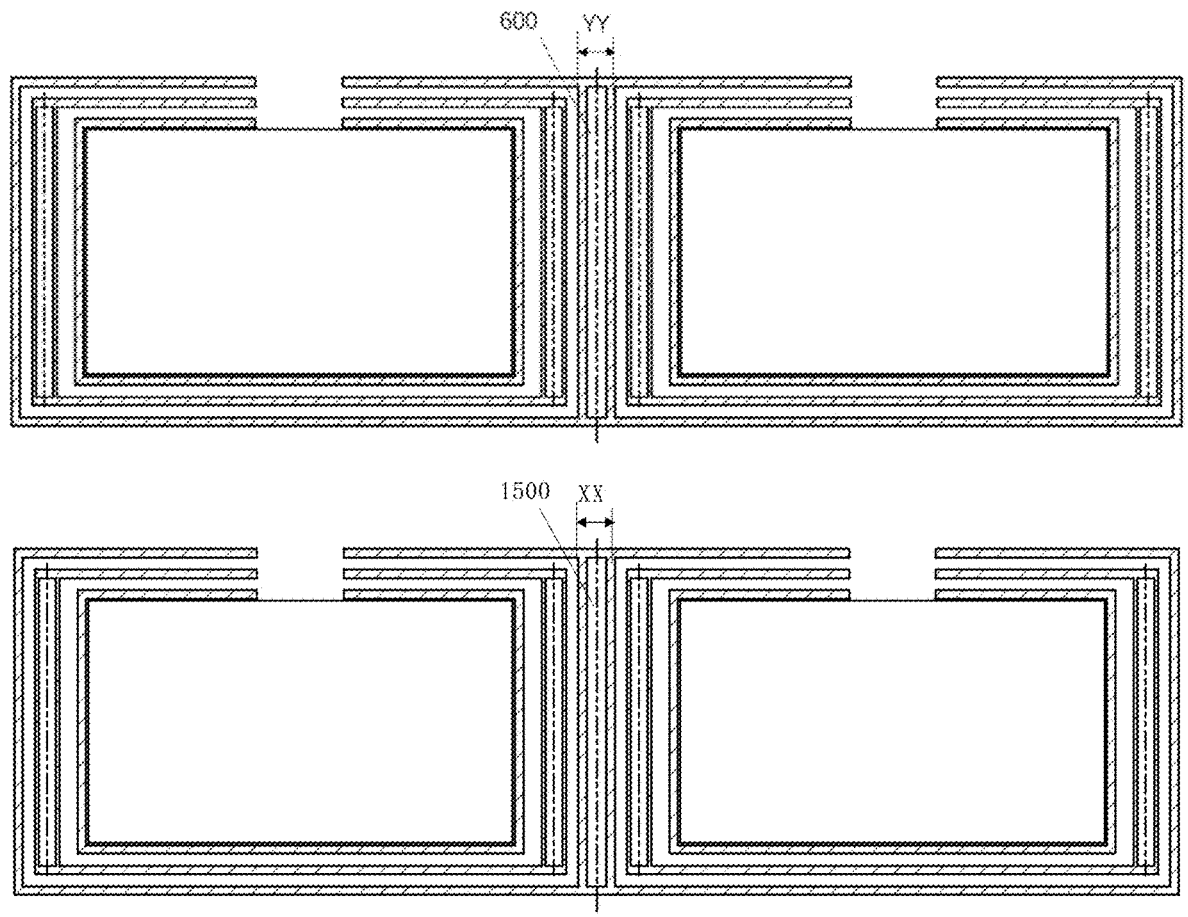
FIG. 15 is a first cross-sectional view of a transformer module provided by an embodiment of the present application.

FIG. 15 is a first cross-sectional view of a transformer module. The transformer module may be a splicing of two independent magnetic column units, or may be two magnetic column units disposed opposite each other on a closed magnetic core. The right magnetic column unit can be considered as being obtained by rotating the left magnetic column unit by 180 degrees on the plane of the top view. The sixth segment of the ninth copper foil of the third winding of the left magnetic column unit is disposed adjacent to the fifth segment of the ninth copper foil of the third winding of the right magnetic column unit; the tenth copper foil of the third winding of the left magnetic column unit is disposed adjacent to the tenth copper foil of the third winding of the right magnetic column unit; and the horizontal copper foils which are disposed to be adjacent are connected together through the waist-shaped hole copper 402 which is obtained by performing copper cladding on the waist-shaped hole 1500. The minimum width XX of the waist-shaped hole is set according to the required copper plating thickness, so the space utilization is more reasonable and the power density is also improved. Optionally, a device may be bridged between the sixth segment and the fifth segment of the ninth copper foil of the right magnetic column unit. Since the waist-shaped hole copper 402 connects the secondary windings (the third windings) of the two magnetic column units, the length of the waist-shaped hole 1500 will be set different from the length of the waist-shaped hole of the primary winding, for example, the secondary winding has a single-turn structure, then the length of the waist-shaped hole 1500 will be set to be significantly larger than the length of the waist-shaped hole of the primary winding (the second winding). Of course, in order to ensure the stability of the structure, a plurality of waist-shaped holes can be disposed at the secondary winding, and then copper cladding is performed on them to obtain a plurality of waist-shaped hole coppers, so as to form a common connecting copper foil corresponding to the secondary winding. The length of the waist-shaped hole is not limited, and horizontal copper connects the plurality of waist-shaped hole coppers together to realize a single-turn winding structure. That is, the at least one magnetic column included in the transformer module includes the first magnetic column and the second magnetic column; the sixth segment of the ninth copper foil and the tenth copper foil of the third winding in the left magnetic column are connected by a common connecting copper foil, (the waist-shaped hole copper 402); the fifth segment of the ninth copper foil and the tenth copper foil of the third winding in the right magnetic column are connected by a common connecting copper foil, (the waist-shaped hole copper 402).

For the corresponding magnetic column units in the following embodiments, the transformer including a plurality of magnetic column units or a plurality of transformer parts can also be obtained by the same splicing method as shown in FIG. 15, and the plurality of transformers are contiguously produced.

Secondly, the multi-layer carrier of the above embodiments may include two carriers: the first carrier and the second carrier, and the corresponding first winding 23, second winding 24 and third winding 25 are described below.

Figure 16:
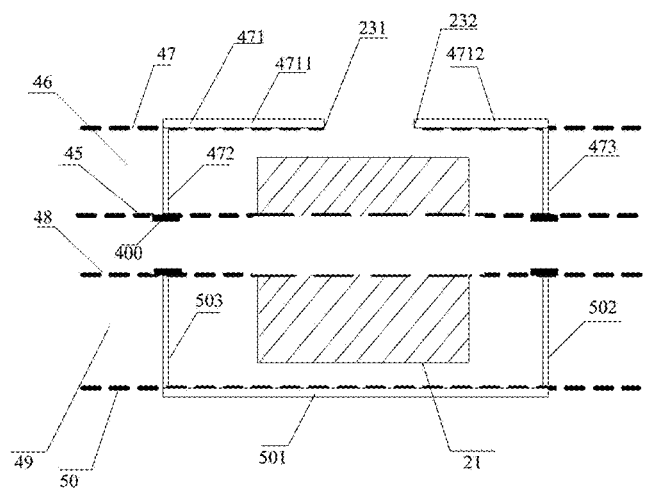
FIG. 16 is a second schematic structural diagram of a first winding provided by an embodiment of the present application.
Figure 17:
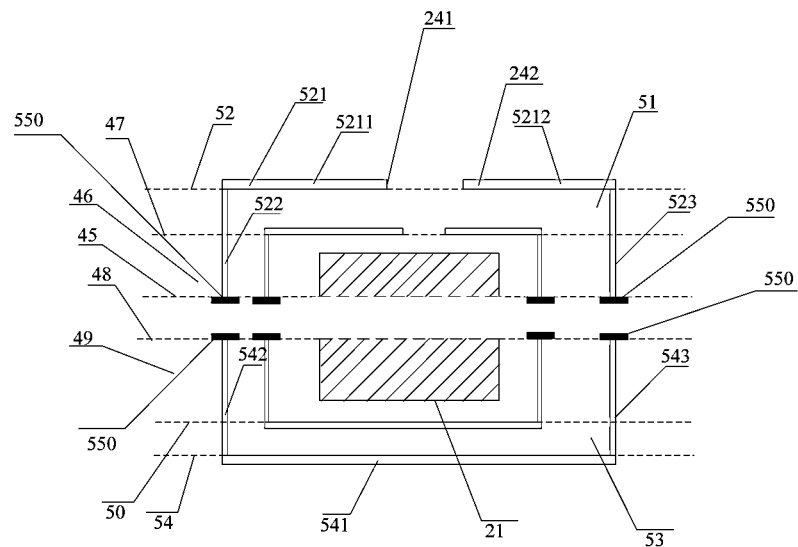
FIG. 17 is a third schematic structural diagram of a second winding provided by an embodiment of the present application.

FIG. 16 is a second schematic structural diagram of a first winding provided by an embodiment of the present application; FIG. 17 is a third schematic structural diagram of a second winding provided by an embodiment of the present application; FIG. 18 is a second schematic structural diagram of a third winding provided by an embodiment of the present application.

Referring to FIG. 16, the multi-layer carrier includes the first carrier and the second carrier; the first carrier and the second carrier are oppositely disposed. The first carrier includes a seventh horizontal wiring layer 45, a sixth insulating layer 46 and an eighth horizontal wiring layer 47 which are sequentially disposed; the second carrier includes a ninth horizontal wiring layer 48, a seventh insulating layer 49 and a tenth horizontal wiring layer 50 which are sequentially disposed; the seventh horizontal wiring layer 45 is used for contacting with the ninth horizontal wiring layer 48; an accommodating groove is formed in the sixth insulating layer 46 of the first carrier and the seventh insulating layer 49 of the second carrier to accommodate at least part of the magnetic column 21.

The horizontal copper foils of the first winding 23 include a thirteenth copper foil 471 and a fourteenth copper foil 501, the connecting copper foils of the first winding 23 include a fifteenth copper foil 472, a sixteenth copper foil 473, a seventeenth copper foil 502 and an eighteenth copper foil 503.

The thirteenth copper foil 471 is disposed on the eighth horizontal wiring layer 47 of the first carrier, and includes a seventh segment 4711 and an eighth segment 4712 spaced apart from each other to form the first end and the second end of the first winding 23, respectively; the fifteenth copper foil 472 and the sixteenth copper foil 473 are disposed penetrating or nearly penetrating the sixth insulating layer 46 of the first carrier and are electrically connected to the thirteenth copper foil 471, respectively; the fourteenth copper foil 501 is disposed on the tenth horizontal wiring layer 50 of the second carrier, and the seventeenth copper foil 502 and the eighteenth copper foil 503 are disposed penetrating or nearly penetrating the seventh insulating layer 49 of the second carrier and are electrically connected to the fourteenth copper foil 501, respectively; when the first carrier and the second carrier are opposite to and in contact with each other and electrically connected, the thirteenth copper foil 471, the fourteenth copper foil 501, the fifteenth copper foil 472, the sixteenth copper foil 473, the seventeenth copper foil 502 and the eighteenth copper foil 503 are connected to each other and surround the accommodating groove. The first carrier and the second carrier are opposite to and in contact with each other and electrically connected, for example, connecting pins 400 may be disposed in the seventh horizontal wiring layer 45 and the ninth horizontal wiring layer 48 and correspond to respective connecting copper foils, and the corresponding connecting copper foils may be connected by a manner of contacting or soldering or the like, so that the thirteenth copper foil 471, the fourteenth copper foil 501, the fifteenth copper foil 472, the sixteenth copper foil 473, the seventeenth copper foil 502 and the eighteenth copper foil 503 are connected to each other to form the first winding 23.

A possible formation process of the first winding 23 shown in FIG. 16 will be described below.

The copper cladded on the eighth horizontal wiring layer 47 is etched to obtain the thirteenth copper foil 471 including the seventh segment and the eighth segment spaced apart from each other; the copper cladded on the tenth horizontal wiring layer 50 obtains the fourteenth copper foil 501; the sixth insulating layer 46 of the first carrier between the seventh horizontal wiring layer 45 and the eighth horizontal wiring layer 47 is penetrated by punching a hole, and the hole is electroplated with copper to form the fifteenth copper foil 472 and the sixteenth copper foil 473; the seventh insulating layer 49 of the second carrier between the ninth horizontal wiring layer 48 and the tenth horizontal wiring layer 50 is penetrated by punching a hole, and the hole is electroplated with copper to form the seventeenth copper foil 502 and the eighteenth copper foil 503; a first end of the fifteenth copper foil 472 and a first end of the sixteenth copper foil 473 are connected to the thirteenth copper foil 471, a second end of the fifteenth copper foil 472 and a second end of the sixteenth copper foil 473 are connected to the seventh horizontal wiring layer 45; a first end of the seventeenth copper foil 502 and a first end of the eighteenth copper foil 503 are connected to the fourteenth copper foil 501, a second end of the seventeenth copper foil 502 and a second end of the eighteenth copper foil 503 are connected to the ninth horizontal wiring layer 48.

The fifteenth copper foil 472, the sixteenth copper foil 473, the seventeenth copper foil 502 and the eighteenth copper foil 503 are formed in a similar manner to the third copper foil 313 and the fourth copper foil 314 shown in FIG. 10, which will not be repeated here.

In another implementation, the manner for forming the first winding in the embodiment shown in FIG. 14A can be referred to for the manner for forming the first winding in this embodiment. The first winding of this embodiment may be formed by laser etching. Specifically, a transition layer can be formed on the surface of the magnetic column 21 by spraying, dipping, electrophoresis, electrostatic spraying, chemical vapor deposition, physical vapor deposition or evaporation with an insulating material, and the thirteenth copper foil 471, the fifteenth copper foil 472, the fourteenth copper foil 501, the seventeenth copper foil 502 and the sixteenth copper foil 473 are formed on the transition layer.

Based on the above process, the first winding 23 is formed. The formation process of the first winding 23 is convenient and flexible; the equivalent diameter of each part of the first winding 23 is similar, and the equivalent impedance is similar, so that the winding current distribution is uniform during the application.

Referring to FIG. 17, the first carrier further includes an eighth insulating layer 51 and an eleventh horizontal wiring layer 52 outside the eighth horizontal wiring layer 47; the second carrier further includes a ninth insulating layer 53 and a twelfth horizontal wiring layer 54 outside the tenth horizontal wiring layer 50.

The horizontal copper foils of the second winding 24 include a nineteenth copper foil 521 and a twentieth copper foil 541, the connecting copper foils of the second winding 24 include a twenty-first copper foil 522, a twenty-second copper foil 523, a twenty-third copper foil 542 and a twenty-fourth copper foil 543.

The nineteenth copper foil 521 is located on the eleventh horizontal wiring layer 52, and includes a ninth segment 5211 and a tenth segment 5212 spaced apart from each other to form the first end and the second end of the second winding 24, respectively; the twentieth copper foil 541 is located on the twelfth horizontal wiring layer 54; the nineteenth copper foil 521, the twentieth copper foil 541, the twenty-first copper foil 522, the twenty-second copper foil 523, the twenty-third copper foil 542 and the twenty-fourth copper foil 543 are connected to each other and surround the accommodating groove, the connection manner thereof can be similar to that of the first windings 23, which is not limited in the present application. For the specific structure and implementation of the surface-mounted pin thereof, please refer to the foregoing drawings and corresponding description. Here, for convenience of description, the vias connected at both ends of the first winding and the respective surface-mounted pins are omitted.

It can be understood that, as described above, the second winding 24 is a primary winding, which may be single-turn or multi-turn. If the second winding 24 is a multi-turn winding, the second winding 24 is a spiral multi-turn winding surrounding the magnetic column 21 formed by etching the nineteenth copper foil 521, the twentieth copper foil 541, the twenty-first copper foil 522, the twenty-second copper foil 523, the twenty-third copper foil 542 and the twenty-fourth copper foil 543.

A possible formation process of the second winding 24 shown in FIG. 17 will be described below.

The copper cladded on the eleventh horizontal wiring layer 52 is etched to obtain the nineteenth copper foil 521 including the ninth segment and the tenth segment spaced apart from each other; the copper cladded on the twelfth horizontal wiring layer 54 obtains the twentieth copper foil 541; the layers between the eleventh horizontal wiring layer 52 and the seventh horizontal wiring layer 45 are penetrated by punching a hole, and the hole is electroplated with copper to form the twenty-first copper foil 522 and the twenty-second copper foil 523, and the layers between the twelfth horizontal wiring layer 54 and the ninth horizontal wiring layer 48 are penetrated by punching a hole, and the hole is electroplated with copper to form the twenty-third copper foil 542 and the twenty-fourth copper foil 543; a first end of the twenty-first copper foil 522 and a first end of the twenty-second copper foil 523 are connected to the nineteenth copper foil 521, a second end of the twenty-first copper foil 522 and a second end of the twenty-second copper foil 523 are connected to a connecting pin 550 of the seventh horizontal wiring layer 45; a first end of the twenty-third copper foil 542 and a first end of the twenty-fourth copper foil 543 are connected to the twentieth copper foil 541, a second end of the twenty-third copper foil 542 and a second end of the twenty-fourth copper foil 543 are connected to a connecting pin 550 of the ninth horizontal wiring layer 48. The corresponding connecting pins 550 of the seventh horizontal wiring layer 45 and the ninth horizontal wiring layer 48 are connected to each other, so that the corresponding copper foils of the first carrier and the second carrier are electrically connected to each other.

The twenty-first copper foil 522, the twenty-second copper foil 523, the twenty-third copper foil 542 and the twenty-fourth copper foil 543 are formed in a similar manner to the third copper foil 313 and the fourth copper foil 314 shown in FIG. 10, which will not be repeated here.

Based on the above process, the second winding 24 is formed. The formation process of the second winding 24 is convenient and flexible; the equivalent diameter of each part of the second winding 24 is similar, and the equivalent impedance is similar, so that the winding current distribution is uniform during the application.

If the second winding 24 is a multi-turn winding, the formation process of the second winding 24 further includes etching the nineteenth copper foil 521, the twentieth copper foil 541, the twenty-first copper foil 522, the twenty-second copper foil 523, the twenty-third copper foil 542 and the twenty-fourth copper foil 543 to form a spiral multi-turn second winding 24 surrounding the magnetic column 21.

Referring to FIG. 18, the first carrier further includes a tenth insulating layer 55 and a thirteenth horizontal wiring layer 56 outside the eleventh horizontal wiring layer 52; the second carrier further includes an eleventh insulating layer 57 and a fourteenth horizontal wiring layer 58 outside the twelfth horizontal wiring layer 54.

The horizontal copper foils of the third winding 25 include a twenty-fifth copper foil 561 and a twenty-sixth copper foil 581, and the connecting copper foils of the third winding 25 include a twenty-seventh copper foil 562, a twenty-eighth copper foil 563, a twenty-ninth copper foil 582 and a thirtieth copper foil 583.

The twenty-fifth copper foil 561 is disposed on the thirteenth horizontal wiring layer 56 of the first carrier, and includes an eleventh segment and a twelfth segment spaced apart from each other to form the first end and the second end of the third winding 25, respectively; the twenty-sixth copper foil 581 is disposed on the fourteenth horizontal wiring layer of the second carrier; the twenty-fifth copper foil 561, the twenty-sixth copper foil 581, the twenty-seventh copper foil 562, the twenty-eighth copper foil 563, the twenty-ninth copper foil 582 and the thirtieth copper foil 583 are connected to each other and surround the accommodating groove. The first carrier and the second carrier are opposite to and in contact with each other and electrically connected to the corresponding horizontal wiring layer to form the multi-layer carrier.

A possible formation process of the third winding 25 shown in FIG. 18 will be described below. For the specific structure and implementation of the surface-mounted pin, please refer to the foregoing drawings and corresponding description. Here, for convenience of description, the vias connected at both ends of the first winding and the second winding as well as the respective surface-mounted pins are omitted.

The copper cladded on the thirteenth horizontal wiring layer 56 is etched to obtain the twenty-fifth copper foil 561 including an eleventh segment 5611 and a twelfth segment 5612 spaced apart from each other; the copper cladded on the fourteenth horizontal wiring layer 58 obtains the twenty-sixth copper foil 581; the layers between the thirteenth horizontal wiring layer 56 and the seventh horizontal wiring layer 45 are penetrated by punching a hole, and the hole is electroplated with copper to form the twenty-seventh copper foil 562 and the twenty-eighth copper foil 563; the layers between the fourteenth horizontal wiring layer 58 and the ninth horizontal wiring layer 48 are penetrated by punching a hole, and the hole is electroplated with copper to form the twenty-ninth copper foil 582 and the thirtieth copper foil 583; a first end of the twenty-seventh copper foil 562 and a first end of the twenty-eighth copper foil 563 are connected to the twenty-fifth copper foil 561, a second end of the twenty-seventh copper foil 562 and a second end of the twenty-eighth copper foil 563 are connected to a connecting pin 550 of the seventh horizontal wiring layer 45; a first end of the twenty-ninth copper foil 582 and a first end of the thirtieth copper foil 583 are connected to the twenty-sixth copper foil 581, a second end of the twenty-ninth copper foil 582 and a second end of the thirtieth copper foil 583 are connected to a connecting pin 550 of the ninth horizontal wiring layer 48. The corresponding connecting pins 550 of the seventh horizontal wiring layer 45 and the ninth horizontal wiring layer 48 are connected to each other, so that the corresponding copper foils of the first carrier and the second carrier are electrically connected to each other.

The twenty-seventh copper foil 562, the twenty-eighth copper foil 563, the twenty-ninth copper foil 582 and the thirtieth copper foil 583 are formed in a similar manner to the third copper foil 313 and the fourth copper foil 314 shown in FIG. 10, which will not be repeated here.

Based on the above process, the third winding 25 is formed. The formation process of the third winding 25 is convenient and flexible; the equivalent diameter of each part of the third winding 25 is similar, and the equivalent impedance is similar, so that the winding current distribution is uniform during the application.

Since the insulating material undergoes a certain degree of chemical shrinkage during molding, stress is generated between the insulating material and the magnetic core due to the degree of shrinkage; and in actual application, the entire transformer module undergoes a certain degree of physical stretching and retraction due to the change in external environment such as humidity and temperature, thus stress is generated between the magnetic column and a peripheral material due to a different degree of stretching and retraction. The peripheral material includes an insulating layer between the first winding and the magnetic core, an insulating layer between the first winding and the second winding, an insulating layer between the second winding and the third winding, the first, second and third metal windings. Whether it is chemical shrinkage or physical stretching and retraction, an equivalent coefficient of thermal expansion (CTE) can be used to characterize the degree of stretching and retraction on its own size caused by the material molding and temperature and humidity changes. Different materials will make the stress increase due to the mismatch of this equivalent CTE, and the magnetic loss will also increase, reducing the efficiency of the entire power module. Therefore, in order to reduce the stress on the magnetic core, from the first preset temperature to the second preset temperature, the selected equivalent CTE of the insulating layer between the first winding and the magnetic column is significantly higher than the equivalent CTE of the insulating layer between the first winding and the second winding. As a result, the degree of shrinkage of the insulating layer between the first winding and the magnetic column is significantly greater than the degree of shrinkage of the peripheral structure thereof, thereby causing a peeling between the insulating layer between the first winding and the magnetic column and its peripheral structure, and the magnetic column is no longer subject to any constraining force. The first preset temperature is the temperature for producing the transformer module, such as 170° C., 190° C., and 230° C., which is not limited in this embodiment; and the second preset temperature may be the room temperature. In another implementation, some materials which can be cracked in a temperature range of more than 170° C. and less than 260° C. may also be selected and used for the insulating layer between the first winding and the magnetic column, such as polyvinyl alcohol (PVA). Wherein the appearance of the PVA powder with thermal stability gradually changes when the PVA powder with thermal stability is heated to about 100° C.; the partially alcoholized PVA starts to melt at about 190° C., and decomposes at 200° C.; the fully alcoholized PVA starts to melt at about 230° C., and decomposes at 240° C. Therefore, the cracking of the material under a certain temperature condition can be achieved by adjusting the degree of alcoholysis, thereby reducing the constraining force on the magnetic column from the peripheral structure of the insulating layer between the first winding and the magnetic column.

Figure 19:
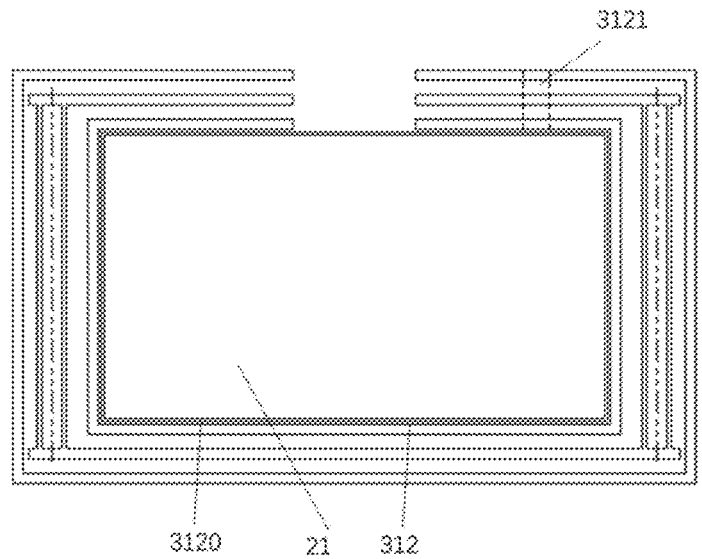
FIG. 19 is a second cross-sectional view of a transformer module provided by an embodiment of the present application.

In order to reduce the force on the magnetic column, another possible structure is considered. A first material is disposed between the magnetic column and the insulating layer between the first winding and the magnetic column, and the first material is a low-melting-point material. The melting point of the first material is lower than 200° C. For example, the first material is paraffin wax, and when the temperature is raised to tens of degrees Celsius, the melting point of the paraffin wax can be reached, and there is no longer any force between the magnetic column and the insulating layer between the first winding and the magnetic column. As shown in FIG. 19, a first material 3120 is disposed between the magnetic column 21 and the insulating layer between the first winding and the magnetic column, and the first material is a low-melting-point material. Whether the insulating layer between the first winding and the magnetic column uses a material which is easy to crack or the low-melting-point material is disposed between the magnetic column and the insulating layer between the first winding and the magnetic column, an exhaust passage needs to be disposed. The exhaust passage is used to exhaust the cracked or melted material to the outside of the module. The exhaust passage penetrates a portion between the surface of the magnetic column and the surface of the transformer module, wherein the exhaust passage 3121 may be located on the upper surface or the lower surfaces of the magnetic column, or may be located on the side of the magnetic column, which is not limited here. As shown in FIG. 19, the exhaust passage 3121 can extend and penetrate from the upper surface of the magnetic column to the upper surface of the transformer module.

Figure 20:
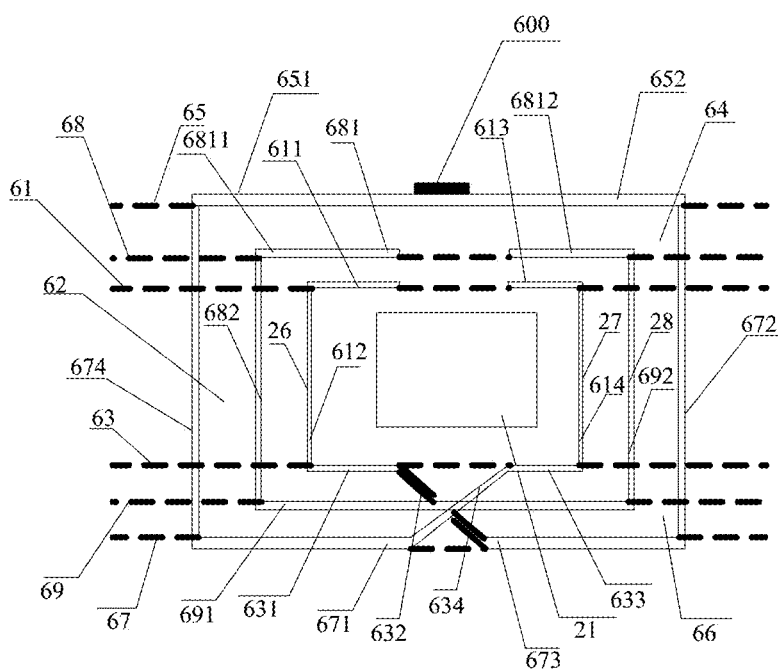
FIG. 20 is a third schematic structural diagram of a transformer module provided by an embodiment of the present application.

The first winding here may be the first winding in the embodiments in which the multi-layer carrier includes a single carrier, and may also be the first winding in the embodiments in which the multi-layer carrier includes two carriers. The second winding here may be the second winding in the embodiments in which the multi-layer carrier includes a single carrier, and may also be the second winding in the embodiments in which the multi-layer carrier includes two carriers. The third winding here may be the third winding in the embodiments in which the multi-layer carrier includes a single carrier, and may also be the third winding in the embodiments in which the multi-layer carrier includes two carriers. When the multi-layer carrier is a PCB, and the transformer module includes the first winding 23, the second winding 24 and the third winding 25 described above, the difference between the equivalent diameter (circumference) of the first winding 23 and that of the third winding 25 is large, and the impedance of the first winding 23 is smaller than the impedance of the third winding 25, which may cause imbalance of energy transfer between the positive and negative half cycles of the transformer in practical applications. In order to solve this problem, the present application proposes a transformer module in the following embodiments. FIG. 20 is a third schematic structural diagram of a transformer module provided by an embodiment of the present application. For the specific structure and implementation of the surface-mounted pin, please refer to the foregoing drawings and corresponding description. Here, for convenience of description, the vias connected at both ends of some of the windings, as well as the respective surface-mounted pins are omitted. Referring to FIG. 20, a transformer module 200 includes a magnetic core, wherein the magnetic core including at least one magnetic column 21, and the magnetic column 21 is at least partially covered by a multi-layer carrier.

The transformer module 200 further includes a fourth winding 26, a fifth winding 27 and a sixth winding 28 surrounding the magnetic column 21. The fourth winding 26 in this embodiment is the first secondary winding, the fifth winding 27 is the second secondary winding, and the sixth winding 28 is the primary winding. For the circuit diagram of the transformer module in this embodiment, please refer to the circuit diagram in the embodiment shown in FIG. 7, which will not be repeated here. In an embodiment, the fourth winding 26 and the fifth winding 27 are connected in series and a center tapped connection pin 600 is used. A multi-layer carrier 22 includes a fifteenth horizontal wiring layer 61, a twelfth insulating layer 62, a sixteenth horizontal wiring layer 63, a thirteenth insulating layer 64, a seventeenth horizontal wiring layer 65, a fourteenth insulating layer 66 and an eighteenth horizontal wiring layer 67, where the twelfth insulating layer 62 is located between the fifteenth horizontal wiring layer 61 and the sixteenth horizontal wiring layer 63, and part of the twelfth insulating layer 62 forms an accommodating groove to accommodate at least part of the magnetic column 21; the thirteenth insulating layer 64 is located between the fifteenth horizontal wiring layer 61 and the seventeenth horizontal wiring layer 65; and the fourteenth insulating layer 66 is located between the sixteenth horizontal wiring layer 63 and the eighteenth horizontal wiring layer 67. The multi-layer carrier 22 further includes a nineteenth horizontal wiring layer 68 and a twentieth horizontal wiring layer 69, where the nineteenth horizontal wiring layer 68 is located between the fifteenth horizontal wiring layer 61 and the seventeenth horizontal wiring layer 65, and further layers the thirteenth insulating layer 64; and the twentieth horizontal wiring layer 69 is located between the sixteenth horizontal wiring layer 63 and the eighteenth horizontal wiring layer 67, and further layers the fourteenth insulating layer 66.

The fourth winding includes a thirty-first copper foil 611, a thirty-second copper foil 612, a thirty-third copper foil 631, a thirty-fourth copper foil 632, a thirty-fifth copper foil 673, a thirty-sixth copper foil 672 and a thirty-seventh copper foil 652 which surround the accommodating groove and are electrically connected. Wherein the thirty-first copper foil 611 is located on the fifteenth horizontal wiring layer 61; the thirty-third copper foil 631 is located on the sixteenth horizontal wiring layer 63; the thirty-fifth copper foil 673 is located on the eighteenth horizontal wiring layer 67; the thirty-seventh copper foil 652 is located on the seventeenth horizontal wiring layer 65; the thirty-second copper foil 612 is disposed to pass through the twelfth insulating layer 62 and connect the thirty-first copper foil 611 and the thirty-third copper foil 631; the thirty-fourth copper foil 632 is disposed to pass through the fourteenth insulating layer 66 and connect the thirty-third copper foil 631 and the thirty-fifth copper foil 673; the thirty-sixth copper foil 672 is disposed to pass through the twelfth insulating layer 62, the thirteenth insulating layer 64 and the fourteenth insulating layer 66, and connect the thirty-fifth copper foil 672 and the thirty-seventh copper foil 652.

The fifth winding includes a thirty-eighth copper foil 613, a thirty-ninth copper foil 614, a fortieth copper foil 633, a forty-first copper foil 634, a forty-second copper foil 671, a forty-third copper foil 674 and a forty-fourth copper foil 651 which surround the accommodating groove and are electrically connected. Wherein the thirty-eighth copper foil 613 is located on the fifteenth horizontal wiring layer 61; the fortieth copper foil 633 is located on the sixteenth horizontal wiring layer 63; the forty-second copper foil 671 is located on the eighteenth horizontal wiring layer 67; the forty-fourth copper foil 651 is located on the seventeenth horizontal wiring layer 65; the thirty-ninth copper foil 614 is disposed to pass through the twelfth insulating layer 62 and connect the thirty-eighth copper foil 613 and the fortieth copper foil 633; the forty-first copper foil 634 is disposed to pass through the fourteenth insulating layer 66 and connect the fortieth copper foil 633 and the forty-second copper foil 671; the forty-third copper foil 674 is disposed to pass through the twelfth insulating layer 62, the thirteenth insulating layer 64 and the fourteenth insulating layer 66, and connect the forty-second copper foil 671 and the forty-fourth copper foil 651; the forty-fourth copper foil 651 and the thirty-seventh copper foil 652 may be connected to the center tapped connection pin 600.

In an implementation, a transition layer can be formed on the surface of the magnetic column 21 by spraying, dipping, electrophoresis, electrostatic spraying, chemical vapor deposition, physical vapor deposition or evaporation with an insulating material. The thirty-first copper foil 611, the thirty-second copper foil 612 and the thirty-third copper foil 631 in the fourth winding 26 are formed on the transition layer; and the thirty-eighth copper foil 613, the thirty-ninth copper foil 614 and the fortieth copper foil 633 in the fifth winding are formed on the transition layer. For a specific process, reference may be made to FIG. 14, and details are not described here again.

The fourth winding includes a first end and a second end, which are one end of the thirty-first copper foil 611 and one end of the thirty-seventh copper foil 652, respectively. The fifth winding includes a fourth end and a third end, which are one end of the thirty-seventh copper foil 651 and one end of the thirty-eighth copper foil 613, respectively.

A sixth surface-mounted pin, a seventh surface-mounted pin, an eighth surface-mounted pin and a ninth surface-mounted pin are located on the surface of the transformer module; the first end of the fourth winding is electrically connected to the sixth surface-mounted pin, and the second end of the fourth winding is electrically connected to the seventh surface-mounted pin; the third end of the fifth winding is electrically connected to the eighth surface-mounted pin, and the fourth end of the fifth winding is electrically connected to the ninth surface-mounted pin. Wherein the sixth surface-mounted pin, the seventh surface-mounted pin, the eighth surface-mounted pin and the ninth surface-mounted pin are located on the surface of the transformer module for connecting the corresponding winding to an external circuit. On the surface of the transformer module, the sixth surface-mounted pin, the seventh surface-mounted pin, the eighth surface-mounted pin and the ninth surface-mounted pin may be spaced apart by an insulating material. In another embodiment, the seventh surface-mounted pin and the ninth surface-mounted pin are the same surface-mounted pin, and the sixth surface-mounted pin, the seventh surface-mounted pin and the eighth surface-mounted pin are disposed on the same surface of the transformer module. Next, the sixth winding 28 in this embodiment will be described.

The sixth winding 28 includes a forty-fifth copper foil 681, a forty-sixth copper foil 682, a forty-seventh copper foil 691 and a forty-eighth copper foil 692 which surround the accommodating groove and are electrically connected; wherein the forty-fifth copper foil 681 is located on the nineteenth horizontal wiring layer 68, the forty-seventh copper foil 691 is located on the twentieth horizontal wiring layer 69, and the forty-fifth copper foil 681 includes a thirteenth segment 6811 and a fourteenth segment 6812, the thirteenth segment 6811 being electrically connected to a tenth surface-mounted pin, and the fourteenth segment 6812 being electrically connected to an eleventh surface-mounted pin; the tenth surface-mounted pin and the eleventh surface-mounted pin are located on the surface of the transformer module. Optionally, there are a plurality of the sixth surface-mounted pins, and the eighth surface-mounted pin further includes a plurality of toothed portions, wherein the plurality of the toothed portions are staggered with the plurality of the sixth surface-mounted pins.

Optionally, there are a plurality of the sixth surface-mounted pins and a plurality of the eighth surface-mounted pins, and the plurality of the sixth surface-mounted pins are staggered with the plurality of the eighth surface-mounted pins.

Figure 21:
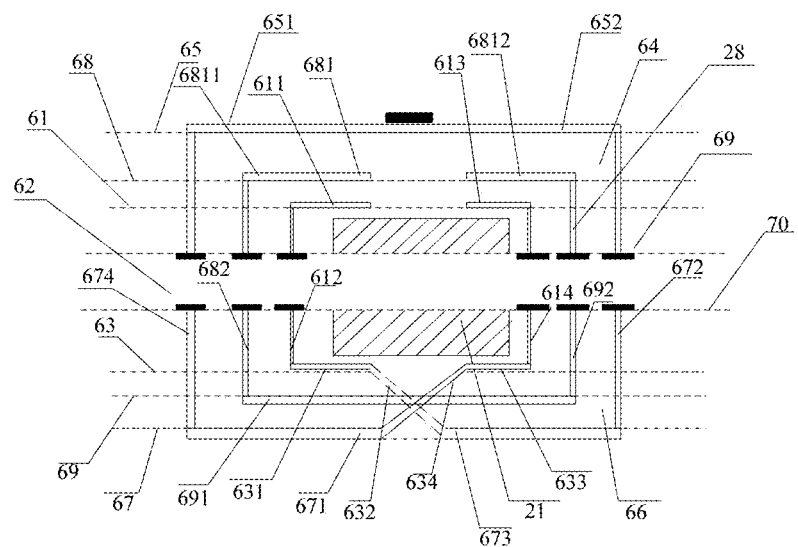
FIG. 21 is a fourth schematic structural diagram of a transformer module provided by an embodiment of the present application.

Further, the multi-layer carrier 22 may be a single carrier, and may also include a first carrier and a second carrier. If the multi-layer carrier 22 includes the first carrier and the second carrier, the transformer module 200 further includes a twenty-first horizontal wiring layer 69 and a twenty-second horizontal wiring layer 70 which are located in the first insulating layer 32 and are in contact with each other, as shown in FIG. 21.

The first carrier includes the fifteenth horizontal wiring layer 61, the seventeenth horizontal wiring layer 65, part of the twelfth insulating layer 62, the thirteenth insulating layer 64 and the twenty-first horizontal wiring layer 69; the second carrier includes the sixteenth horizontal wiring layer 63, the eighteenth horizontal wiring layer 67, part of the twelfth insulating layer 62, the fourteenth insulating layer 66 and the twenty-second horizontal wiring layer 70; wherein the first carrier and the second carrier form the multi-layer carrier 22 by the contact of the twenty-first horizontal wiring layer and the twenty-second horizontal wiring layer.

The equivalent diameters (circumferences) of two secondary windings of the transformer module in this embodiment are almost equal, and the impedance is also almost equal, so that the energy transfer between the positive and negative half cycles of the transformer is relatively balanced in practical applications.

For the transformer structure shown in FIG. 20, in the case where the forty-sixth copper foil 682 and the forty-eighth copper foil 692 are waist-shaped hole copper, at least one waist-shaped hole is disposed between the first side of the forty-fifth copper foil 681 and the first side of the forty-ninth copper foil 691, the inner surface of each waist-shaped hole forms first waist-shaped hole copper, and the first waist-shaped hole copper forms the forty-sixth copper foil 682; and at least one waist-shaped hole is disposed between the second side of the forty-fifth copper foil 681 and the second side of the forty-ninth copper foil 691, the inner surface of each waist-shaped hole forms second waist-shaped hole copper, and the second waist-shaped hole copper forms the forty-eighth copper foil 692. In an implementation, the outer edge of the forty-sixth copper foil 682, the first side of the forty-fifth copper foil 681 and the first side of the forty-ninth copper foil 691 are flush, or the first side of the forty-fifth copper foil 681 and the first side of the forty-ninth copper foil 691 are located on the inner side of the forty-sixth copper foil 682; the outer edge of the forty-eighth copper foil 692, the second side of the forty-fifth copper foil 681 and the second side of the forty-ninth copper foil 691 are flush, or the second side of the forty-fifth copper foil 681 and the second side of the forty-ninth copper foil 691 are located on the inner side of the forty-eighth copper foil 692.

Further, the transformer module includes an inner insulating layer and an outer insulating layer. From 170° C. to the room temperature, the equivalent coefficient of thermal expansion of the inner insulating layer is higher than the equivalent coefficient of thermal expansion of the outer insulating layer; the cracking temperature of the inner insulating layer is 170° C. to 260° C. In another possible implementation, a low-melting-point material is disposed between the inner insulating layer and the magnetic column, and the melting temperature of the low-melting-point material is lower than 200° C.; or the inner insulating layer is a material that is easy to crack; and an exhaust passage is disposed and can exhaust the cracked or melted material to the outside of the module, as described in detail with reference to the foregoing embodiments. The inner insulating layer may be an insulating layer between the magnetic column and the thirty-first copper foil 611, the thirty-second copper foil 612, the thirty-third copper foil 631 of the fourth winding 26, and the thirty-eighth copper foil 613, the thirty-ninth copper foil 614, the fortieth copper foil 633 of the fifth winding 37. The insulating layer other than the inner insulating layer is the outer insulating layer.

In addition, in the embodiment shown in FIG. 20 or FIG. 21, if at least one magnetic column includes a first magnetic column and a second magnetic column, a horizontal copper foil of the outermost winding surrounding the first magnetic column is disposed adjacent to a horizontal copper foil of the outermost winding surrounding the second magnetic column, and the adjacent horizontal copper foils are connected by a common connecting copper foil. The common connecting copper foil may be waist-shaped hole copper.

Figure 22A:
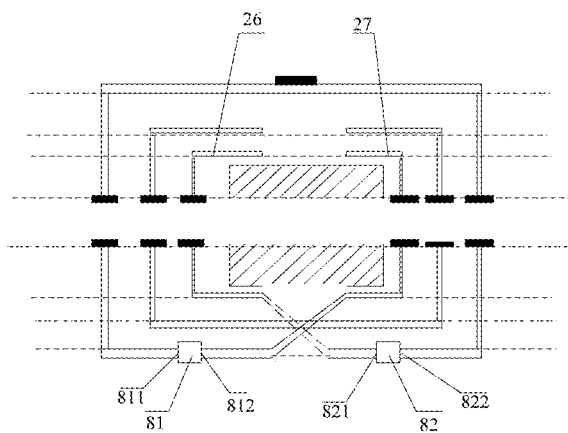
FIG. 22A is a schematic diagram of a first carrier and a second carrier of a transformer module when they have not been soldered.
Figure 22B:
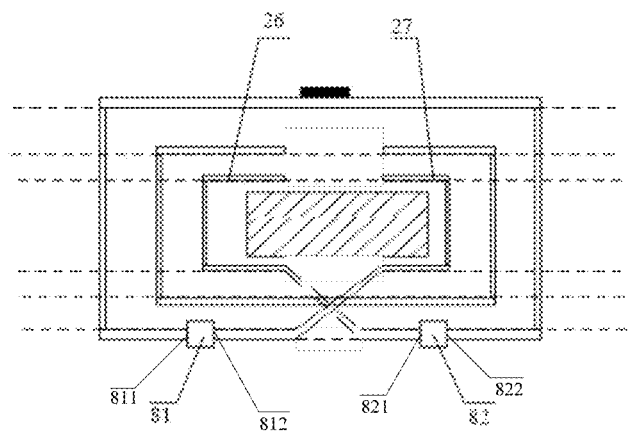
FIG. 22B is a schematic diagram of a first carrier and a second carrier of a transformer module after being soldered.

FIG. 22A is a schematic diagram of a first carrier and a second carrier of a transformer module before being soldered; FIG. 22B is a schematic diagram of a first carrier and a second carrier of a transformer module after being soldered, or a schematic diagram of a multi-layer carrier that is a single carrier. Herein, for convenience of description, the vias connected at both ends of the first winding and the second winding, as well as the respective surface-mounted pins are omitted. On the basis of the transformer module shown in FIGS. 20 and 21, the transformer module of this embodiment further includes a first switching device 81 and a second switching device 82, wherein the first switching device 81 and the second switching device 82 each include a first end and a second end. At this time, optionally, the transformer module can no longer be connected to a switch module.

The fourth winding 26 also has a first interval to form a first breakpoint 811 and a second breakpoint 812, wherein the first breakpoint 811 is electrically connected to the first end of the first switching device 81, and the second breakpoint 812 is electrically connected to the second end of the first switching device 81.

The fifth winding 27 also has a second interval to form a third breakpoint 821 and a fourth breakpoint 822, wherein the third breakpoint 821 is electrically connected to the first end of the second switching device 82, and the fourth breakpoint 822 is electrically connected to the second end of the second switching device 82; and the sixth surface-mounted pin and the eighth surface-mounted pin can be the same pin.

Figure 24:
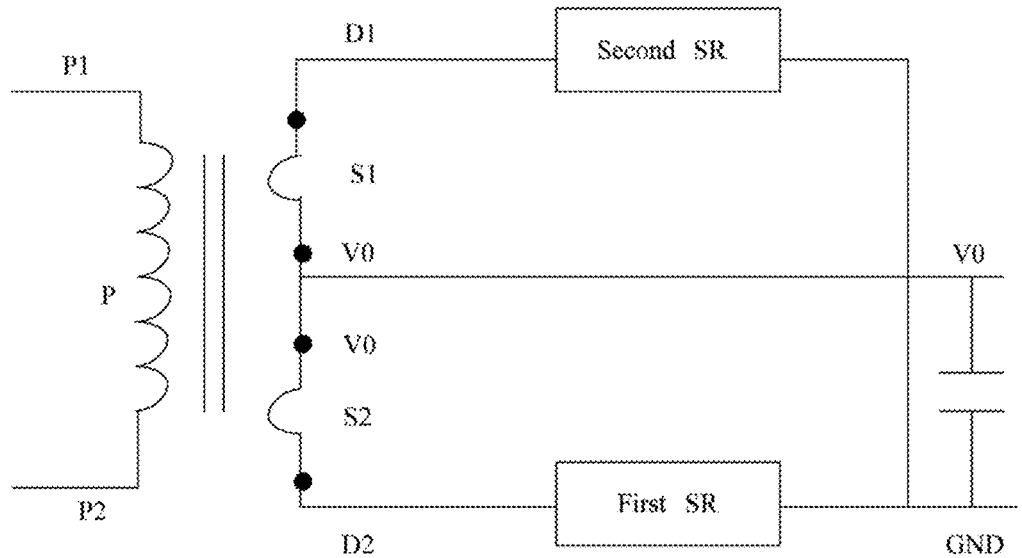
FIG. 24 is a schematic electrical diagram of end points of a power module provided by an embodiment of the present application.

When a circuit shown in FIG. 24 is implemented using this structure, the sixth surface-mounted pin and the eighth surface-mounted pin can simultaneously serve as the terminal GND in the circuit diagram, and the seventh surface-mounted can serve as the terminal V0; or the sixth surface-mounted pin and the eighth surface-mounted pin can serve as the terminal V0 in the circuit diagram, and the seventh surface-mounted pin can serve as the GND. The present application is not limited thereto.

The transformer module may also not include the switching device. Only the first breakpoint, the second breakpoint, the third breakpoint and the fourth breakpoint are formed on the fourth winding and the fifth winding, and a pad is formed on each of the breakpoints to be electrically connected to an external circuit, such as a switch module. The present application is not limited thereto.

In the present application, the manner for forming the connecting copper foil includes various forms such as being formed in a via, a wiring trench, a waist-shaped hole by a metallization process, or being formed directly on the transition layer by a metallization process, and the present invention is not limited thereto. For example, the first winding is formed by the metallization process on the transition layer, the connecting copper foil of the second winding is implemented by the waist-shaped hole, the connecting copper foil of the third winding is implemented by the via or the wiring trench; or all of the connecting copper foils of the windings in the transformer module are implemented by vias, or by waist-shaped holes, to facilitate automatic production; or the connecting copper foil of the secondary winding in the transformer module is implemented by the via or the wiring trench, and the connecting copper foil of the primary winding is implemented by the waist-shaped hole, so as to increase the through-current capability.

In the transformer module of the present application, the second winding at least partially covers the first winding, the third winding at least partially covers the second winding, and so on. Of course, the transformer module of the present application is not limited to three-layer windings, and may include a fourth winding, a fifth winding, etc. The transformer structure of the present application may include one primary winding and one secondary winding; or one primary winding and two secondary windings; or two primary windings and two secondary windings. That is, the number of primary and secondary windings and the number of turns can be flexibly set.

The power module according to the present application will be described below with reference to specific embodiments.

Figure 23A:
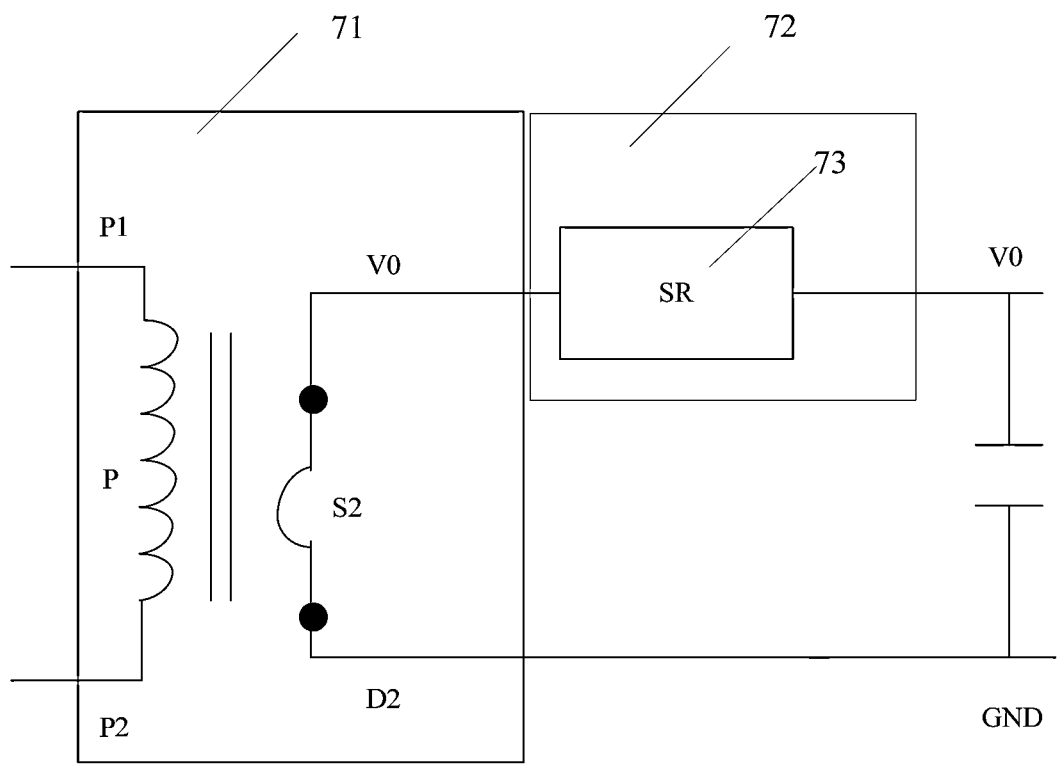
FIG. 23A is a first schematic electrical diagram of end points of a power module provided by an embodiment of the present application.
Figure 23B:
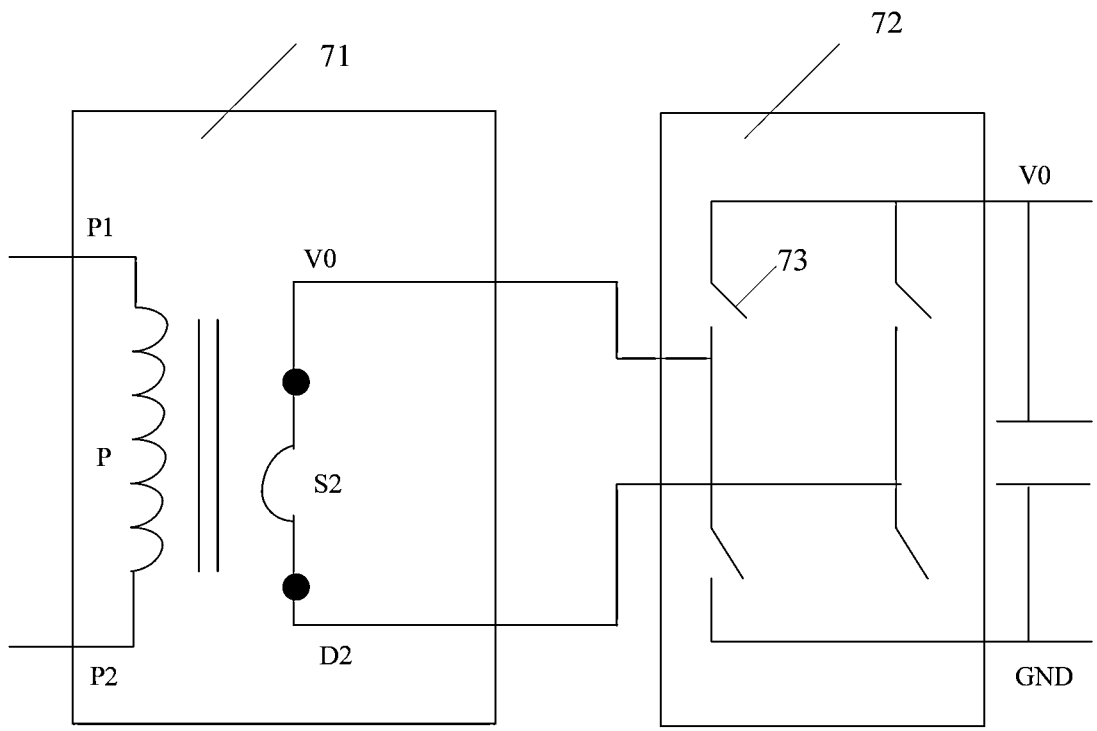
FIG. 23B is a second schematic electrical diagram of end points of a power module provided by an embodiment of the present application.
Figure 23C:
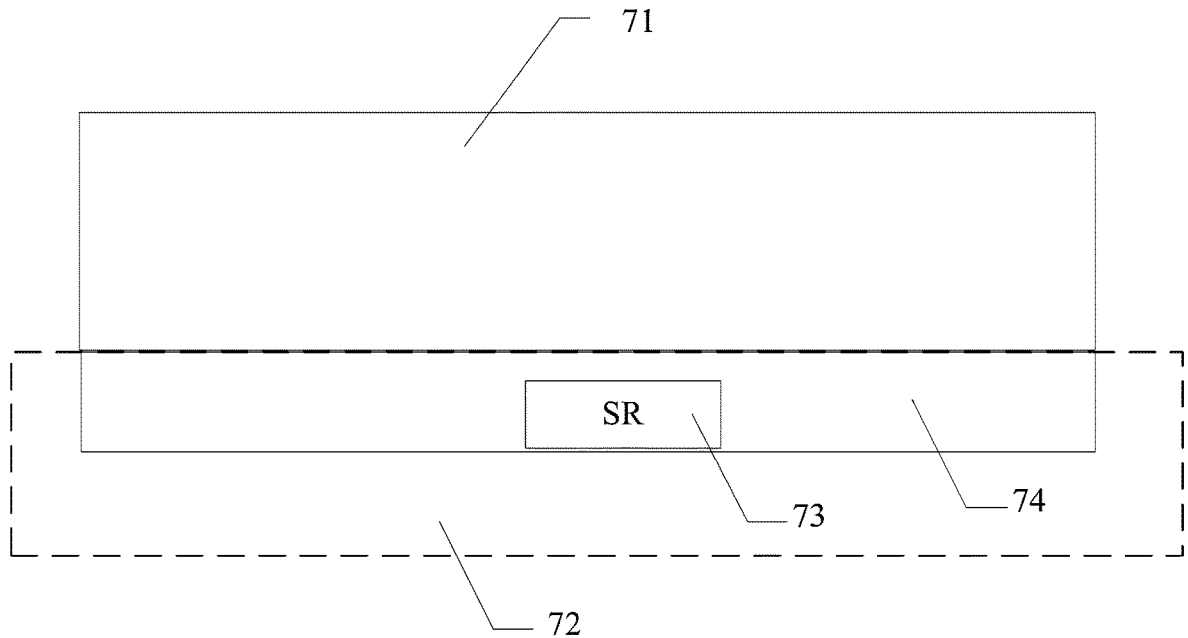
FIG. 23C is a first cross-sectional view of a power module provided by an embodiment of the present application.
Figure 23D:
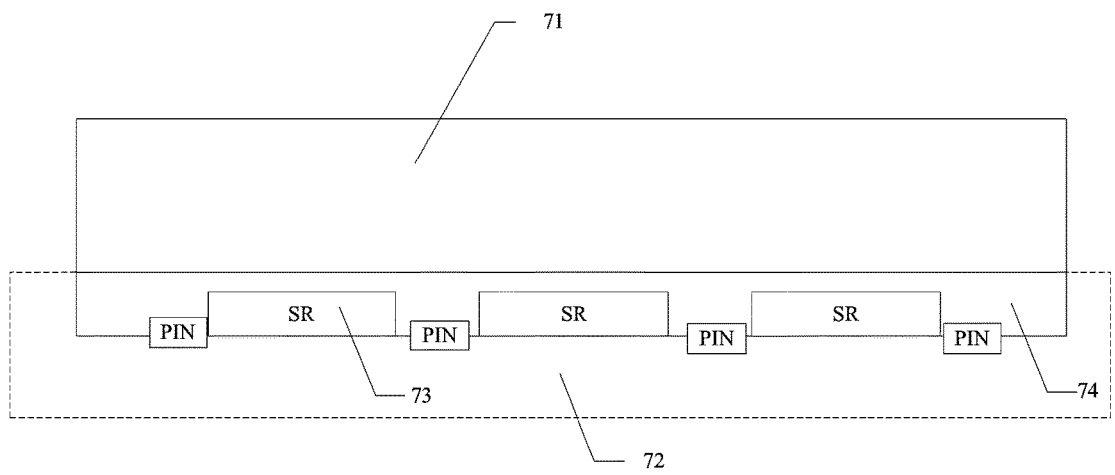
FIG. 23D is a second cross-sectional view of a power module provided by an embodiment of the present application.

FIG. 23A is a first schematic electrical diagram of end points of a power module provided by an embodiment of the present application, FIG. 23B is a second schematic electrical diagram of end points of a power module provided by an embodiment of the present application, FIG. 23C is a first cross-sectional view of a power module provided by an embodiment of the present application, and FIG. 23D is a second cross-sectional view of a power module provided by an embodiment of the present application. The power module will be described in conjunction with FIG. 23A-FIG. 23D. The power module includes:

a transformer module 71 according to the embodiment shown in FIG. 2-FIG. 5;

a switch module 72, wherein the switch module 72 is in contact with a first surface of the transformer module 71 (for example, a bottom surface having a pin) and electrically connected to the first surface-mounted pin and the second surface-mounted pin.

Optionally, the switch module 72 includes a carrier 74 and at least one power switch (SR) 73; as shown in FIG. 23A and FIG. 23C, the switch module 72 includes at least one power switch 73; as shown in FIG. 23B and FIG. 23D, the switch module includes at least one full bridge circuit formed by interconnecting at least four power switches; and the power switch is disposed on the carrier 74. According to a practical application of the circuit topology, the power switch can be electrically connected to the first surface-mounted pin and/or the second surface-mounted pin. The present application is not limited thereto. The power switch can also be connected to other pins, and according to the actual output power of the transformer, each power switch may include a plurality of switch elements in parallel. The power switch can be located on the lower surface of the transformer module, or the power switch can also be located on the upper surface of the transformer module, which is not limited in the present application.

Optionally, the power switch as shown in FIG. 23A and FIG. 23C can be placed on transformer module directly, and the power switch can be electrically connected to the first surface-mounted pin and/or the second surface-mounted pin. That is to say, the switch module 72 doesn't include the carrier 74.

The power switch may be a diode, a metal-oxide-semiconductor field-effect transistor (MOSFET), an insulated gate bipolar transistor (IGBT), or the like.

Figure 23E:
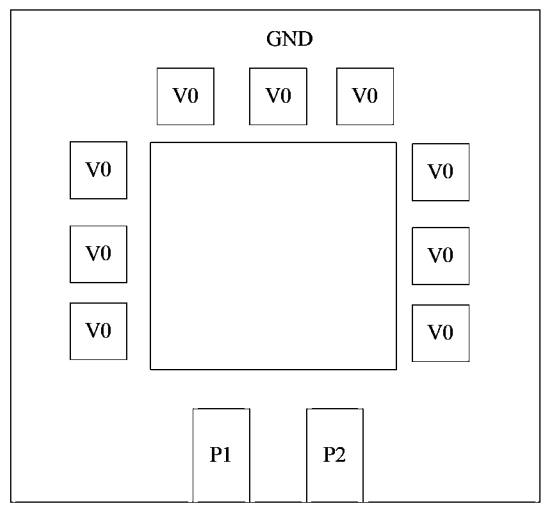
FIG. 23E is a bottom view of a switch module provided by an embodiment of the present application.
Figure 23F:
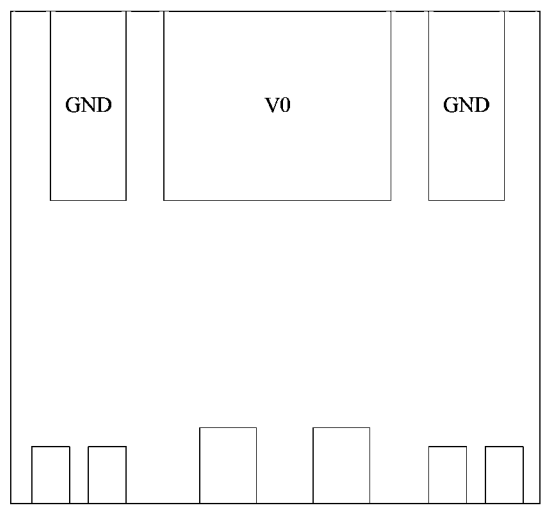
FIG. 23F is a bottom view of a switch module provided by an embodiment of the present application.
Figure 23G:
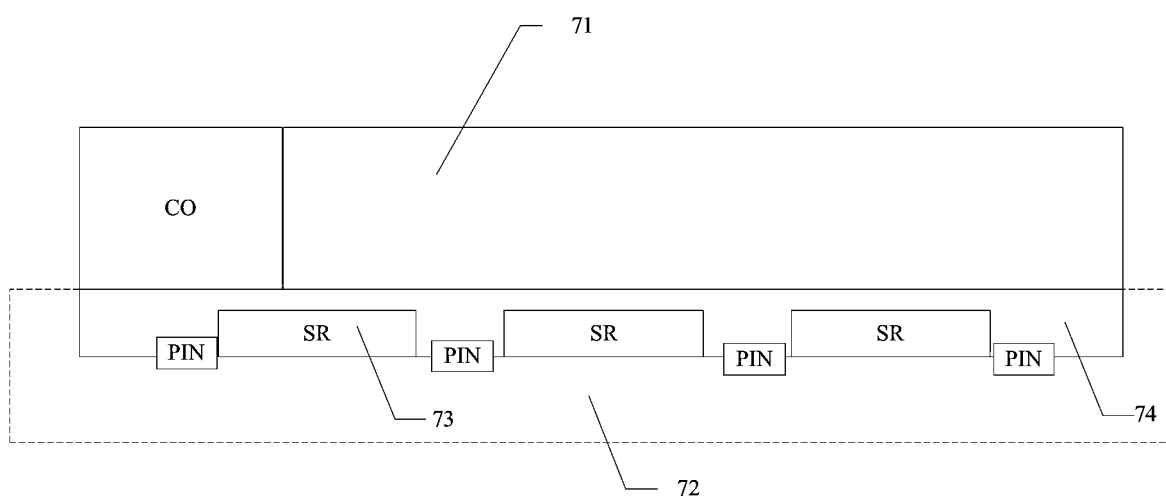
FIG. 23G is a third cross-sectional view of a power module provided by an embodiment of the present application.

Specifically, an un-packaged bare die of one or multiple paralleling SRs can be directly integrated into one carrier by an embedded process to form the switch module. The power switch can be placed just below the surface-mounted pins for easy connection to the surface-mounted pins. And one pin may connect to plurality of switches. For example, FIG. 5 shows that D2 and V0 are both one square or C-shape pin. If the size of the power switch or the pins of the power switch is smaller than the size of the transformer module, one D2 or V0 pin can connect to multiple power switches. That also means multiple power switches are connected in parallel. And FIG. 9 is similar. In conjunction with FIG. 8A and FIG. 8B, in these embodiments, a plurality of the fifth surface-mounted pins serving as the terminals D1 and a plurality of the toothed portions of the first surface-mounted pin serving as the terminals D2 can be used to connect a plurality of power switches. FIG. 23E is a bottom view of a switch module provided by an embodiment of the present application, and FIG. 23F is a bottom view of a switch module provided by an embodiment of the present application. FIGS. 23E and 23F depict the allocation of the output terminals of the switch module, such as V0, GND etc., which locate on one surface of the switch module. The pins of the switch module which connect to the transformer module are located on another surface of the carrier. As shown in FIG. 23E, a pad corresponding to the transformer module is formed on the upper surface of the carrier; as shown in FIG. 23F, an output pin terminal (PIN) of the transformer power unit can be formed on the lower surface of the carrier, such as V0, GND, etc. The corresponding transformer module is then soldered to the carrier to form the power module, as shown in FIGS. 23C and 23D. Further, the power module further includes a capacitor module disposed on the carrier and adjacent to the transformer module, and the capacitor module is electrically connected to the second surface-mounted pin V0. The capacitor module may include an LLC power unit, a controller, an output capacitor, an input capacitor etc., so that the power module serves as an LLC converter. Specifically, FIG. 23G is a cross-sectional view of a power module provided by an embodiment of the present application, as shown in FIG. 23G, Co is an output capacitor. In some other embodiments, the capacitor may also be located adjacent to the same side of the switch device SR on the carrier board; or the capacitor may also be embedded in the carrier board; even if the capacitor is placed on the upper surface of the magnetic core, the power switch SR is placed on the lower surface of the magnetic core. And in some embodiment, the capacitor module or the switch module can be placed on the multi-layer carrier of the transformer module. That is to say, the switches, the input/output capacitors, the controller etc. can be placed directly on the multi-layer carrier of the transformer module.

The power module can also include only a primary power unit, a resonant unit, a controller, an output capacitor, and the like.

It should be noted that the above power module is not limited to the LLC converter, but is also applicable to any circuit including a transformer module, such as a flyback converter, a full bridge circuit, and the like.

On the basis of the embodiment shown in FIG. 23, the present application further provides a power module, wherein the power module includes a transformer module similar to the embodiment shown in FIG. 6. The transformer module further includes a third winding electrically connected in series with the first winding and a fifth surface-mounted pin serving as the terminal D1, wherein the fifth surface-mounted pin is located on a first surface (e.g., a bottom surface) of the transformer module; a first end of the third winding is electrically connected to the fifth surface-mounted pin serving as the terminal D1, and a second end of the third winding is electrically connected to the second surface-mounted pin serving as the terminal V0; the rest will not be repeated here.

FIG. 24 is a schematic electrical diagram of end points of a power module provided by an embodiment of the present application, as shown in FIG. 24, after the transformer module and the switch module are stacked, the switch module is also electrically connected to the fifth surface-mounted pin serving as the terminal D1.

Further, as shown in FIG. 24, the power module further includes a first power switch (SR) and a second power switch (SR), wherein a first end of the first power switch is electrically connected to the first surface-mounted pin serving as the terminal D2, a first end of the second power switch is electrically connected to the fifth surface-mounted pin serving as the terminal D1, and a second end of the first SR and a second end of the second SR are electrically connected.

It can be seen that the power module is easy to be modularized. A plurality of SRs are firstly integrated on one carrier to form a switch module; a plurality of transformer modules are then surface-mounted to the carrier; and finally cutting is performed, so that a plurality of power modules can be produced at one time. However, the present application is not limited thereto.

Further, the power switches are directly connected with a plurality of output PINs of the transformer module, and the connection loss is small; the primary and secondary winding of the transformer module are directly coupled together, the AC (alternating current) impedance of the winding is small, and the AC loss is small. However, the present application is not limited thereto.

Figure 25:
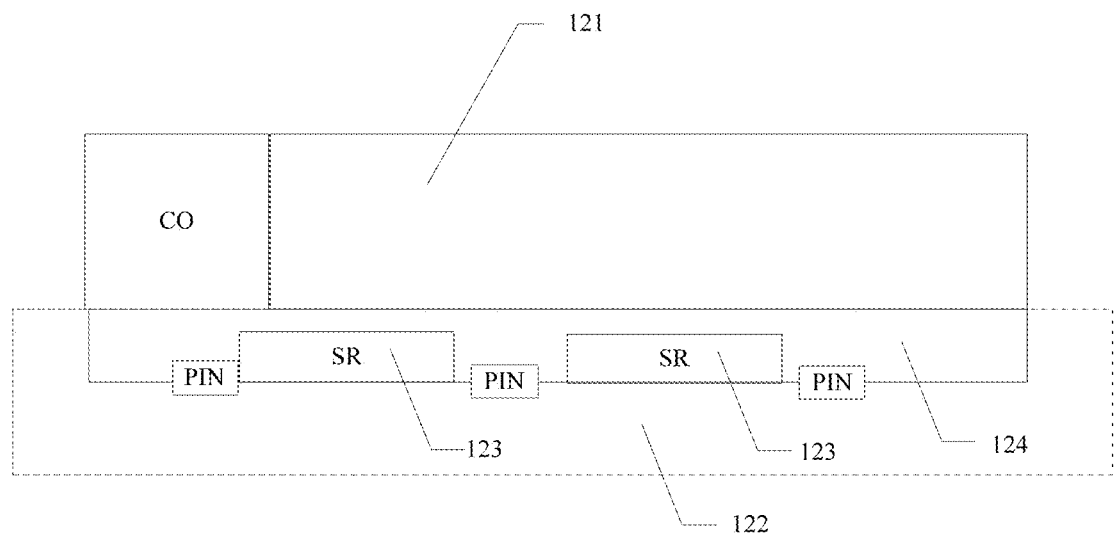
FIG. 25 is a cross-sectional view of a power module provided by an embodiment of the present application.

FIG. 25 is a cross-sectional view of a power module provided by another embodiment of the present application, as shown in FIG. 25, the power module includes:

a transformer module 121 of the embodiment e.g. the transformer module shown in FIGS. 20~21;

a switch module 122, wherein the switch module 122 is in contact with a first surface of the transformer module 121 (for example, a bottom surface having a pin) and is electrically connected to the sixth surface-mounted pin and the eighth surface-mounted pin.

Optionally, the switch module 122 includes a carrier 124 and at least one power switch (SR) 123; as shown in FIG. 25, the switch module 122 includes a power switch 123, and the power switch 123 is disposed on the carrier 124. According to a practical application of the circuit topology, the power switch can be electrically connected to the sixth surface-mounted pin and/or the eighth surface-mounted pin. The present application is not limited thereto. The power switch can also be connected to other pins. Wherein, as shown in FIG. 25, the power switch can be located on the lower surface of the transformer module, or the power switch can also be located on the upper surface of the transformer module, which is not limited in the present application.

Optionally, the switch module includes a carrier and at least one SR, wherein the SR is disposed on the carrier, and the SR is electrically connected to the sixth surface-mounted pin and the eighth surface-mounted pin. The SR may be located on the lower surface or the upper surface of the transformer module (as shown in FIG. 25), which is not limited in the present application.

The SR may be a diode, a MOSFET, an IGBT, or the like.

Specifically, an un-packaged bare die of one or multiple paralleling SRs can be directly integrated into one carrier by an embedded process to form the switch module. A pad corresponding to the transformer module is formed on the upper surface of the carrier; and an output pin terminal (PIN) of the transformer power unit can be formed on the lower surface of the carrier, such as the eleventh surface-mounted pin serving as the terminal GND. The corresponding transformer module is then soldered to the carrier to form the power module.

Alternatively, one or more paralleling SRs and the output PINs of the transformer power unit are firstly soldered to the lower surface of the carrier; the switch module is then formed by a molding process; a pad corresponding to the transformer module is formed on the upper surface of the carrier, and the transformer module is soldered on the upper surface of the carrier, so as to form the power module.

Further, the power module further includes a capacitor module, wherein the capacitor module is in contact with the second surface of the transformer module, and is electrically connected to the seventh surface-mounted pin and the eleventh surface-mounted pin. Specifically, the capacitor module may include an LLC power unit, a controller, an output capacitor, etc., so that the power module serves as an LLC converter. Or, as shown in FIG. 25, the capacitor module includes a Co, wherein Co is an output capacitor.

Alternatively, the power module may include only a primary power unit, a resonant unit, a controller, an output capacitor, and the like.

Alternatively, the switches, the input/output capacitors, the controller etc. can also be placed directly on the multi-layer carrier of the transformer module.

Figure 26:
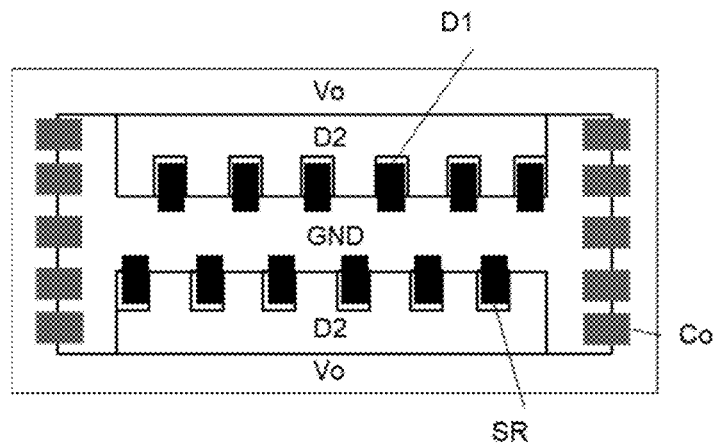
FIG. 26 is a fourth bottom view of a transformer module provided by an embodiment of the present application.

For FIG. 22A and FIG. 22B, the switching device SR may be further integrated into the transformer module in the form of the first switching device 81 and the second switching device 82. At this time, the switch module can be no longer needed; the output capacitor, the primary power unit, the resonant unit, the controller and the like as included in FIG. 23 and FIG. 24 can be selectively integrated into a module and electrically connected to the transformer module, or can be electrically connected to the transformer module, respectively, which is not limited in the present application. FIG. 26 is a bottom view of a transformer module provided by an embodiment of the present application; as shown in FIG. 26, the surface-mounted pins of the transformer module are arranged in a similar manner to that of FIG. 8B, and multiple sets of the first switching devices SR, the second switching devices SR and the output capacitors are further added on the basis of FIG. 8B. Two ends of the first switching device are respectively placed on the pads of the terminals D1 and GND, and are electrically connected to the corresponding pads; two ends of the second switching device are respectively placed on the pads of the terminals D2 and GND, and are electrically connected to the corresponding pads; two ends of the output capacitor are respectively placed on the pads of the terminals V0 and GND, and are electrically connected to the corresponding pads. It should be noted that the above power module is not limited to the LLC converter, but is also applicable to any circuit including a transformer module, such as a flyback converter, a full bridge circuit, and the like.

What is claimed is:

1. A transformer module, comprising:
   a magnetic core, comprising at least one magnetic column being at least partially covered by a multi-layer carrier; and
   a first winding and a second winding surrounding the magnetic column;
   wherein the multi-layer carrier comprises a first horizontal wiring layer, a first insulating layer, a second horizontal wiring layer, a second insulating layer, a third horizontal wiring layer, a third insulating layer and a fourth horizontal wiring layer, wherein the first insulating layer is located between the first horizontal wiring layer and the second horizontal wiring layer, and part of the first insulating layer forms an accommodating groove to accommodate at least part of the magnetic column; the second insulating layer is located between the first horizontal wiring layer and the third horizontal wiring layer; and the third insulating layer is located between the second horizontal wiring layer and the fourth horizontal wiring layer;
   the first winding comprises a first foil, a second foil, a third foil, a fourth foil, a fifth foil, a sixth foil and a seventh foil, which surround the accommodating groove and are electrically connected, wherein the first foil is located on the first horizontal wiring layer, the third foil is located on the second horizontal wiring layer, the fifth foil is located on the fourth horizontal wiring layer, and the seventh foil is located on the third horizontal wiring layer; the second foil is disposed to pass through the first insulating layer and connect the first foil and the third foil; the fourth foil is disposed to pass through the third insulating layer and connect the third foil and the fifth foil; the sixth foil is disposed to pass through the first insulating layer, the second insulating layer and the third insulating layer, and connect the fifth foil and the seventh foil;
   the second winding comprises an eighth foil, a ninth foil, a tenth foil, an eleventh foil, a twelfth foil, a thirteenth foil and a fourteenth foil, which surround the accommodating groove and are electrically connected, wherein the eighth foil is located on the first horizontal wiring layer, the tenth foil is located on the second horizontal wiring layer, the twelfth foil is located on the fourth horizontal wiring layer, and the fourteenth foil is located on the third horizontal wiring layer; the ninth foil is disposed to pass through the first insulating layer and connect the eighth foil and the tenth foil; the eleventh foil is disposed to pass through the third insulating layer and connect the tenth foil and the twelfth foil; the thirteenth foil is disposed to pass through the first insulating layer, the second insulating layer and the third insulating layer, and connect the twelfth foil and the fourteenth foil;
   the first winding comprises a first end and a second end, and the second winding comprises a third end and a fourth end;
   a first pin, a second pin, a third pin and a fourth pin are located on at least one surface of the transformer module, the first end of the first winding is electrically connected to the first pin, the second end of the first winding is electrically connected to the second pin, the third end of the second winding is electrically connected to the third pin, and the fourth end of the second winding is electrically connected to the fourth pin.

2. The transformer module according to claim 1, wherein, the transformer module further comprises a third winding; the multi-layer carrier further comprises a fifth horizontal wiring layer and a sixth horizontal wiring layer, wherein the fifth horizontal wiring layer is located between the first horizontal wiring layer and the third horizontal wiring layer, and the sixth horizontal wiring layer is located between the second horizontal wiring layer and the fourth horizontal wiring layer; the third winding comprises a fifteenth foil, a sixteenth foil, a seventeenth foil and an eighteenth foil, which surround the accommodating groove and are electrically connected, wherein the fifteenth foil is located on the fifth horizontal wiring layer, the seventeenth foil is located on the sixth horizontal wiring layer, and the fifteenth foil comprises a fifth segment and a sixth segment, the fifth segment of the fifteenth foil is electrically connected to a fifth pin, and the sixth segment of the fifteenth foil is electrically connected to a sixth pin; and the fifth pin and the sixth pin are located on a surface of the transformer module.

3. The transformer module according to claim 1, wherein, the second pin and the fourth pin are the same pin, and the first pin, the second pin and the third pin are located on the at least one surface of the transformer module.

4. The transformer module according to claim 1, wherein, the transformer module further comprises a first switching device and a second switching device, wherein the first switching device and the second switching device each comprise a first end and a second end;
   the first winding further has a first interval to form a first breakpoint and a second breakpoint, the first breakpoint is electrically connected to the first end of the first switching device, and the second breakpoint is electrically connected to the second end of the first switching device;

the second winding further has a second interval to form a third breakpoint and a fourth breakpoint, the third breakpoint is electrically connected to the first end of the second switching device, and the fourth breakpoint is electrically connected to the second end of the second switching device.

5. The transformer module according to claim 1, wherein the multi-layer carrier comprises a first carrier and a second carrier oppositely disposed;

the transformer module further comprises a seventh horizontal wiring layer and an eighth horizontal wiring layer which are located in the first insulating layer;

the first carrier comprises the first horizontal wiring layer, the third horizontal wiring layer, the second insulating layer, the seventh horizontal wiring layer and part of the first insulating layer;

the second carrier comprises the second horizontal wiring layer, the fourth horizontal wiring layer, the third insulating layer, the eighth horizontal wiring layer and part of the first insulating layer.

6. The transformer module according to claim 5, wherein the first carrier and the second carrier form the multi-layer carrier through contacting the seventh horizontal wiring layer and the eighth horizontal wiring layer.

7. The transformer module according to claim 2, wherein the multi-layer carrier comprises a first carrier and a second carrier oppositely disposed;

the transformer module further comprises a seventh horizontal wiring layer and an eighth horizontal wiring layer which are located in the first insulating layer and in contact with each other;

the first carrier comprises the first horizontal wiring layer, the third horizontal wiring layer, the second insulating layer, the fifth horizontal wiring layer, the seventh horizontal wiring layer and part of the first insulating layer;

the second carrier comprises the second horizontal wiring layer, the fourth horizontal wiring layer, the third insulating layer, the sixth horizontal wiring layer, the eighth horizontal wiring layer and part of the first insulating layer;

wherein the first carrier and the second carrier form the multi-layer carrier through contacting the seventh horizontal wiring layer and the eighth horizontal wiring layer.

8. The transformer module according to claim 1, wherein, there are a plurality of the third pins, the first pin further comprises a plurality of toothed portions, and the plurality of the toothed portions are staggered with the plurality of the third pins; or, there are a plurality of the first pins and a plurality of the third pins, and the plurality of the first pins are staggered with the plurality of the third pins; or, there is one third pin, and the third pin is located between the first pin and the second pin.

9. The transformer module according to claim 2, wherein the third winding is a spiral multi-turn winding surrounding the magnetic column formed by etching the fifteenth foil, the sixteenth foil, the seventeenth foil and the eighteenth foil.

10. The transformer module according to claim 1, wherein the first end of the first winding is electrically connected to the first pin through a first connection piece; the third end of the second winding is electrically connected to the third pin through a second connection piece; and the first connection piece and the second connection piece pass through the second insulating layer.

11. The transformer module according to claim 1, wherein the at least one magnetic column comprises a first magnetic column and a second magnetic column; a horizontal foil of an outermost winding surrounding the first magnetic column is disposed adjacent to a horizontal foil of an outermost winding surrounding the second magnetic column, and the adjacent horizontal foils are connected by a common connecting foil.

12. The transformer module according to claim 1, wherein a transition layer is formed on a surface of the magnetic column by spraying, dipping, electrophoresis, electrostatic spraying, chemical vapor deposition, physical vapor deposition or evaporation with an insulating material; the first foil, the second foil and the third foil of the first winding are formed on the transition layer; and the eighth foil, the ninth foil and the tenth foil of the second winding are formed on the transition layer.

13. The transformer module according to claim 2, wherein the third winding is a multi-turn winding, and a connecting foil comprised in each turn of the multi-turn winding is waist-shaped hole.

14. The transformer module according to claim 2, wherein at least one waist-shaped hole is disposed between a first side of the fifteenth foil and a first side of the seventeenth foil, an inner surface of each of the at least one waist-shaped hole forms a first waist-shaped hole copper, and the first waist-shaped hole copper forms the sixteenth foil;

at least one waist-shaped hole is disposed between a second side of the fifteenth foil and a second side of the seventeenth foil, an inner surface of each of the at least one waist-shaped hole forms a second waist-shaped hole copper, and the second waist-shaped hole copper forms the eighteenth foil.

15. The transformer module according to claim 14, wherein the first side of the fifteenth foil and the first side of the seventeenth foil do not protrude from an outer edge of the sixteenth foil; and the second side of the fifteenth foil and the second side of the seventeenth foil do not protrude from an outer edge of the eighteenth foil.

16. The transformer module according to claim 1, wherein from a first preset temperature to a second preset temperature, an equivalent coefficient of thermal expansion of an insulating layer among the first foil, the second foil, the third foil, the eighth foil, the ninth foil, the tenth foil and the magnetic column is higher than an equivalent coefficient of thermal expansion of other insulating layer; or a decomposition temperature of an insulating layer among the first foil, the second foil, the third foil, the eighth foil, the ninth foil, the tenth foil and the magnetic column is 170° C.-260° C.; or a low-melting-point material is disposed between the magnetic column and an insulating layer among the first foil, the second foil, the third foil, the eighth foil, the ninth foil, the tenth foil and the magnetic column, and a melting temperature of the low-melting-point material is lower than 200° C.

17. The transformer module according to claim 1, wherein the transformer module further comprises an exhaust passage disposed to penetrate a portion between a surface of the magnetic column and a surface of the transformer module.

18. A power module, comprising:
a transformer module according to claim 1; and
a switching module, wherein the switching module is in contact with the transformer module and electrically connected to the first pin and the third pin.

19. The power module according to claim 18, wherein the switching module comprises a switch carrier and at least one power switch, the power switch is disposed on the switch carrier, and the power switch is electrically connected to the first pin and/or the third pin; and the power module further comprises a capacitor module, the capacitor module is disposed on the switch carrier and adjacent to the transformer module, and the capacitor module is electrically connected to the first pin.

20. The power module according to claim 18, wherein the second winding electrically connected to the first winding, the power module further comprises a first power switch and a second power switch, wherein a first end of the first power switch is electrically connected to the first pin, a first end of the second power switch is electrically connected to the third pin, and a second end of the first power switch is electrically connected to a second end of the second power switch.

* * * * *